United States Patent
Vigoda et al.

(10) Patent No.: US 8,107,306 B2
(45) Date of Patent: Jan. 31, 2012

(54) STORAGE DEVICES WITH SOFT PROCESSING

(75) Inventors: Benjamin Vigoda, Winchester, MA (US); Eric Nestler, Concord, MA (US); Jeffrey Bernstein, Middleton, MA (US); David Reynolds, Scarborough, ME (US); Alexander Alexeyev, Gorham, ME (US); Jeffrey Venuti, Somerville, MA (US); William Bradley, Somerville, MA (US); Vladimir Zlatkovic, Belmont, MA (US)

(73) Assignee: Analog Devices, Inc., Norwood, MA (US)

( * ) Notice: Subject to any disclaimer, the term of this patent is extended or adjusted under 35 U.S.C. 154(b) by 358 days.

(21) Appl. No.: 12/537,081

(22) Filed: Aug. 6, 2009

(65) Prior Publication Data

US 2010/0246289 A1  Sep. 30, 2010

Related U.S. Application Data

(60) Provisional application No. 61/164,078, filed on Mar. 27, 2009, provisional application No. 61/180,313, filed on May 21, 2009.

(51) Int. Cl.
*G11C 7/00* (2006.01)
(52) U.S. Cl. .................. 365/191; 365/198; 365/189.15; 365/189.17
(58) Field of Classification Search .................. 365/191, 365/198, 189.15, 189.17
See application file for complete search history.

(56) References Cited

U.S. PATENT DOCUMENTS

| | | | |
|---|---|---|---|
| 5,172,338 A | 12/1992 | Mehrotra et al. |
| 6,094,368 A | 7/2000 | Ching |
| 6,212,654 B1 | 4/2001 | Lou et al. |
| 6,279,133 B1 | 8/2001 | Vafai |
| 6,339,546 B1 | 1/2002 | Katayama |
| 6,714,462 B2 | 3/2004 | Pan |
| 6,744,299 B2 | 6/2004 | Geysen |
| 6,990,018 B2 | 1/2006 | Tanaka |
| 7,388,791 B2 | 6/2008 | Kato et al. |
| 7,394,704 B2 | 7/2008 | Tanaka |
| 7,437,631 B2 | 10/2008 | Auclair |

(Continued)

FOREIGN PATENT DOCUMENTS

EP  0 802 540 A  10/1997

(Continued)

OTHER PUBLICATIONS

Winstead, "*Analog Soft Decoding for Multi-level Memories*", IEEE Computer Society, Downloaded on Mar. 17, 2009 from IEEE Xplore.

(Continued)

*Primary Examiner* — Vu Le
*Assistant Examiner* — Han Yang
(74) *Attorney, Agent, or Firm* — Occhiuti Rohlicek & Tsao LLP

(57) ABSTRACT

A storage device includes a storage array having a group of storage elements. Each storage element can written to a discrete set of physical states. A read circuit selects one or more storage elements and generates, for each selected storage element, an analog signal representative of the physical state of the selected storage element. A signal processing circuit processes the analog signal to generate a plurality of outputs, with each output representing a degree of an association of the selected storage element with a different subset of one or more of the discrete set of physical states.

18 Claims, 25 Drawing Sheets

U.S. PATENT DOCUMENTS

| | | |
|---|---|---|
| 7,533,328 B2 | 5/2009 | Alrod |
| 7,616,481 B2 | 11/2009 | Mokhlesi |
| 7,716,413 B2 | 5/2010 | Lasser |
| 7,716,415 B2 | 5/2010 | Sharon |
| 7,719,889 B2 | 5/2010 | Lin |
| 7,818,653 B2 | 10/2010 | Brandman |
| 2003/0021149 A1 | 1/2003 | So et al. |
| 2003/0217323 A1 | 11/2003 | Guterman |
| 2004/0136472 A1 | 7/2004 | Vigoda |
| 2005/0128807 A1 | 6/2005 | Chen |
| 2005/0204262 A1* | 9/2005 | Berens et al. ............... 714/755 |
| 2006/0114814 A1 | 6/2006 | Kasami |
| 2007/0086239 A1 | 4/2007 | Litsyn |
| 2007/0237006 A1 | 10/2007 | Murin |
| 2007/0245214 A1 | 10/2007 | Ramamoorthy |
| 2008/0082897 A1 | 4/2008 | Brandman |
| 2008/0092014 A1 | 4/2008 | Brandman |
| 2008/0092015 A1 | 4/2008 | Brandman |
| 2008/0092026 A1 | 4/2008 | Brandman |
| 2008/0109702 A1 | 5/2008 | Brandman |
| 2008/0109703 A1 | 5/2008 | Brandman |
| 2008/0123419 A1 | 5/2008 | Brandman |
| 2008/0123420 A1* | 5/2008 | Brandman et al. ....... 365/185.09 |
| 2008/0151617 A1 | 6/2008 | Alrod |
| 2008/0244162 A1 | 10/2008 | Mokhlesi |
| 2008/0244360 A1 | 10/2008 | Mokhlesi |
| 2008/0263266 A1 | 10/2008 | Sharon |
| 2009/0245423 A1* | 10/2009 | RostamPisheh et al. ..... 375/316 |
| 2010/0088575 A1 | 4/2010 | Sharon |
| 2010/0165738 A1 | 7/2010 | Cernea |
| 2010/0174845 A1 | 7/2010 | Gorobets |
| 2010/0220514 A1 | 9/2010 | Vigoda |
| 2010/0246287 A1 | 9/2010 | Vigoda |
| 2010/0246289 A1 | 9/2010 | Vigoda et al. |

FOREIGN PATENT DOCUMENTS

| | | |
|---|---|---|
| EP | 1 137 001 | 9/2001 |
| KR | 1019980022518 | 7/1998 |
| WO | 00/41507 | 7/2000 |
| WO | 2007/133963 | 11/2007 |
| WO | 2008/042593 | 4/2008 |
| WO | 2008/042598 | 4/2008 |
| WO | 2008/057820 | 5/2008 |
| WO | 2008/057822 | 5/2008 |
| WO | 2008/121577 | 10/2008 |
| WO | 2008/129534 | 10/2008 |
| WO | WO 2010/111589 | 9/2010 |

OTHER PUBLICATIONS

Sequin, et al., "*Analogue 16-QAM demodulator*", Electronics Letter, Sep. 2, 2004, vol. 40, No. 18.

International Search Report for PCT/US2010/028826, Oct. 29, 2010.

* cited by examiner

One example of 3-bit Gray Code

| Input Value (y) | Symbols | Bits ($b_2, b_1, b_0$) |
|---|---|---|
| -1 | $S_0$ | 0 0 0 |
| 1 | $S_1$ | 0 0 1 |
| 3 | $S_2$ | 0 1 1 |
| 5 | $S_3$ | 0 1 0 |
| 7 | $S_4$ | 1 1 0 |
| 9 | $S_5$ | 1 1 1 |
| 11 | $S_6$ | 1 0 1 |
| 13 | $S_7$ | 1 0 0 |

FIG. 11

Digital shuffler ($b_0$)

| Input Bit Sequence | Code | Sign Bit | Output Bit Sequence |
|---|---|---|---|
| 000000 | 0000 | 0 | 0000 |
| ... | ... | ... | ... |
| 001111 | 1111 | 0 | 1111 |
| 010000 | 0000 | 1 | 1111 |
| ... | ... | ... | ... |
| 011111 | 1111 | 1 | 0000 |
| 100000 | 0000 | 0 | 0000 |
| ... | ... | ... | ... |
| 101111 | 1111 | 0 | 1111 |
| 110000 | 0000 | 1 | 1111 |
| ... | ... | ... | ... |
| 111111 | 1111 | 1 | 0000 |

FIG. 15

STORAGE DEVICES WITH SOFT PROCESSING

CROSS-REFERENCE TO RELATED APPLICATIONS

This application claims the benefit of U.S. Provisional Application Ser. No. 61/164,078, titled "Memory Devices with Soft Processing," filed Mar. 27, 2009, and U.S. Provisional Application Serial No. 61/180,313, titled "Memory Devices with Soft Processing," filed May 21, 2009. This application is also related to U.S. Provisional Application Ser. No. 61/156,721, titled "Signal Mapping," filed Mar. 2, 2009, U.S. Provisional Application Ser. No. 61/156,792, titled "Belief Propagation Processor," filed Mar. 2, 2009, U.S. Patent Application Ser. No. 61/156,794, titled "Circuits for Soft Logical Functions," filed Mar. 2, 2009. This application is also related to U.S. patent application Ser. No. 12/537,060, filed concurrently with the present application, and U.S. patent application Ser. No. 12/537,045, filed concurrently with the present application. The contents of the above applications are incorporated herein by reference.

STATEMENT AS TO FEDERALLY SPONSORED RESEARCH

This invention was made with government support under contract FA8750-07-C-0231 awarded by the Defense Advanced Research Projects Agency (DARPA). The government has certain rights in the invention.

BACKGROUND

This specification relates to storage devices with soft processing.

Memory devices are widely used for storage of information. There are two main categories of memory devices: volatile memories, which generally need electrical power to maintain their stored information, and non-volatile memories, which can retain the stored information even when not powered. Common examples of volatile memories include dynamic random access memory (DRAM) and static random access memory (SRAM). Common examples of non-volatile memories include read-only memory (ROM) and flash memory.

In many semiconductor-based memory devices, data is stored in an array of memory cells. FIG. 1 shows one example of a two-dimensional memory array 110 in which cells 112 are arranged into columns and rows. Each cell 112 is connected to its neighboring cells via a pair of word line $W_i$ and bit line $B_i$ that together defines a unique physical address for the cell. Based on its address, each cell can be accessed (e.g., written, read, and/or erased) individually or in groups (e.g., words, pages) depending on the architecture of the memory device.

In an example of a flash memory, a cell 112 can be made from a floating-gate transistor that has a source (S), a drain (D), a control gate (CG), and a floating gate (FG). During a "write" (also known as "program") operation, data is written to the cell 112 by injecting a certain amount of electrical charge onto the FG to alter the threshold voltage ($V_T$) of the cell. Here, the threshold voltage $V_T$ refers to the lowest voltage applied to the CG of the cell that is sufficiently high to induce a source-drain current.

The $V_T$ of a flash memory cell is usually in a physical range, known as the "voltage window," defined by a minimum voltage value $V_{min}$ and a maximum voltage value $V_{max}$. The voltage window can be partitioned into two or more threshold voltage domains to define a set of different logic states (e.g., "0," "1," "2," ...) to which a cell can be written. For example, for a memory that stores a single bit per cell (also referred to as a memory of binary cells), the voltage window is divided into two threshold voltage domains that respectively represent state "0" and "1." For a memory that stores a string of 3 bits per cell, the voltage window is divided into 8 (i.e., $2^3$) domains, each of which represents a different one of the 8 logic states of the cell.

In some examples of flash memory, to read a memory cell, the threshold voltage of the cell is compared with a set of reference voltages representative of the threshold voltage domains defining the logic states. A signal is generated by sensing the source-drain current of the cell to determine whether the cell's threshold voltage is higher or lower than the reference voltage with which it is compared, and consequently, to which logic state the cell was last written.

As with most devices, memory devices are susceptible to errors. There are various factors that may affect the reliability of the write and read results of a memory device. One example is the aging of certain types of memory cells that causes a gradual shift in the voltage window and the threshold voltage domains that define the logic states of the cells. Due to aging, the number of times for which these types of memory cells can be re-programmed is generally limited. Another example is the variations in the fabrication process that may cause certain cells to behave differently than others when read or programmed. A further example is the random noise that limits the precision of the read and/or program circuitry.

Some memory designs make use of error reduction and/or error correction schemes to improve the reliability (e.g., read/write accuracy) of memory devices. FIG. 2 shows one example of a flash memory device 200 with error correction functionality. In this example, a memory array 210 resides together with a set of one or more reference cells 220 on a memory chip 250. Each reference cell carries a reference voltage that may be applied in a pre-defined order to the control gate of a selected memory cell for generating a signal representing the source-drain current i of this cell. (In some other examples, references voltages may be swept to control the gate of selected memory cells to generate signals.) This current i is then compared in a comparator 230 or a thresholding device (e.g., a sense amplifier) against a threshold current $i_{th}$ to produce a "hard" (digital) bit, i.e., "0" or "1," representing the result of comparison. Subsequently, the output of the comparator 230 is translated in a translation unit 232, for example, according to a control signal provided by a controller 231 that also controls the sequential application of reference voltages, to generate a bit string representing the data stored in the cell. As a group of memory cells are read, a digital bit stream is produced representing the stored data in those cells. Note that this bit stream is likely to include errors for reasons described above. In this example, to improve the data reliability and reduce the bit error rate (BER) of the memory device, error correction codes (ECC) may be used in write operations to introduce carefully designed redundancy to generate a coded bit string (codewords) representing the original information to be stored. To recover the original information in a read operation, the stream of the sensed (observed) coded bit strings may be sent to an external controller chip 260 to be decoded in an ECC decoder module 240.

SUMMARY

Some general aspects of the invention provide a storage device having a storage array of a group of storage elements.

Each storage element can be programmed to a discrete set of physical states. A read circuit selects one or more storage elements and generates, for each selected storage element, an analog signal representative of the physical state of the selected storage element. A signal processing circuit processes the analog signal to generate a group of outputs, with each output representing a degree of an association of the selected storage element with a different subset of one or more of the discrete set of physical states.

Embodiments may include one or more of the following features.

In some embodiments, each output of the signal processing circuit is a continuous-valued signal.

The storage device further includes a second signal processing circuit for processing the group of outputs of the signal processing circuit to generate a digital representation of a stored value of the selected storage element.

A control circuit is coupled to the signal processing circuit for generating a control signal to change a mapping characteristic from the analog signal generated by the read circuit to the set of outputs. The control circuit may be configured for changing the mapping characteristic based on an expected degree of variability of the analog signal generated by the read circuit. The expected degree of variability includes noise variance.

The expected degree of variability may also include non-uniformity of noise characteristics and/or non-uniformity in the spacing of the mapping.

In some embodiments, each output of the signal processing circuit represents a probability of the selected storage element being at a respective one of the discrete set of physical states (sometimes referred to as symbol probability), and each one of the discrete set of physical states corresponds to a respective storage value. Each storage value may correspond to a bit string, and the signal processing circuit may generate the outputs to represent the probabilities of a respective digit of the bit string having the value of "0" or "1" (sometimes referred to as bit probability).

In some embodiments, the storage array includes a group of floating-gate memory cells. In some other embodiments, the storage array includes a group of dynamic random access memory (DRAM) cells. In some further embodiments, the storage array includes a group of capacitive elements, each of which may have one or more capacitors. In some further embodiments, the storage array includes a group of phase-change memory (PCM) cells.

In a read operation, the read circuit applies a reference voltage to the selected storage element to generate the analog signal representative of the physical state of the selected storage element. The analog signal can be a current-encoded signal or a voltage-encoded signal and be provided to the signal processing circuit in a single-ended or differential form.

Each output of the signal processing circuit may represent the degree of the association, for instance, as a probability representation in a linear domain, or in a log domain (e.g., using a log-probability based representation or a log likelihood ratio based representation). In some examples, each output may have a signal level determined as in linear proportion to the probability representation, or determined as a monotonic function of the probability representation.

In some embodiments, the signal processing circuit includes an analog signal processor that transforms the analog signal to the group of outputs. In some other embodiments, the signal processing circuit includes a digital processing logic for processing binary representations determined from the analog signal.

In some embodiments, the storage device further includes a non-linear signal transformation circuit coupled between the read circuit and the signal processing circuit.

Another general aspect of the invention provides a storage device having a storage array with a group of storage elements, each storage element operable to be programmed to a discrete set of physical states. The storage device also includes a read circuit for selecting one or more storage elements and generating, for each selected storage element, an analog signal representative of the physical state of the selected storage element. The storage device further includes a signal processing circuit having a first module and a second module. The first module processes the analog signal to generate a set of one or more outputs, with each output representing a degree of an association of the selected storage element with a subset of one or more of the discrete set of physical states, and the second module for processing the set of one or more outputs of the first module to generate a digital representation of a stored value of the selected storage element.

In some embodiments, the first module may include one or more features of a demapper circuit described in U.S. Patent Application Ser. No. 61/156,721, titled "Signal Mapping," filed Mar. 2, 2009. The second module may include one or more features of a decoder circuit described in U.S. Patent Application Ser. No. 61/156,792, titled "Belief Propagation Processor," filed Mar. 2, 2009.

Another general aspect of the invention provides a storage system having a first section and a second section interfacing the first section. In some examples, the first and the section are implemented as two integrated circuits coupled by a communication link.

The first section includes a storage array having a group of storage elements, with each storage element being operable to be written to one of a discrete set of N physical states. The first section also includes a read circuit for selecting one or more storage elements and generating, for each selected storage element, an analog signal representative of the physical state of the selected storage element. A modulation circuit is provided for accepting the analog signal to form a modulated representation of the analog signal from the read circuit. This modulated representation is capable of representing more than N different states.

The second section includes a demodulation circuit for accepting the modulated representation of the analog signal from the modulation circuit to recover the analog signal. A signal processing circuit processes the recovered analog signal to generate a plurality of outputs, with each output representing a degree of an association of the selected storage element with a different subset of one or more of the discrete set of physical states.

Embodiments of this aspect may include one or more of the following features.

The modulation circuit in the first section includes an analog-to-digital converter (ADC). The demodulation circuit in the second section includes a digital-to-analog converter (DAC). The ADC may include a linear ADC component or a non-linear ADC component (e.g., a logarithmic ADC component).

The modulated representation of the analog signal from the read circuit includes a signal of multiple quantization levels. This signal of multiple quantization levels may be transmitted via a serial line, or alternatively, via multiple parallel lines, to the demodulation circuit.

In some embodiments, the modulation circuit is further configured for applying a signal modulation technique to the analog signal from the read circuit to form a modulated representation of the analog signal. The signal modulation technique includes pulse width modulation, pulse amplitude modulation, quadrature amplitude modulation, phase modulation, or pulse-position modulation. It may also include stochastic modulation, in which case the modulated representation of the analog signal is provided as a random binary sequence of a specified probabilistic distribution.

A further aspect of the invention provides a circuit having a signal processing circuit for accepting a discrete-valued input characterizing an observation of a signal and for generating a set of continuous-valued outputs, with each output characterizing a corresponding log likelihood ratio (LLR) based measure of an association of the signal with one or more of a set of representative levels. The signal processing circuit includes a group of mapping circuits, each mapping circuit being configured to map a different range of the discrete-valued input to a respective discrete-valued output signal according to a modeling of the characteristics of the observation of the signal. The signal processing circuit also includes a group of conversion circuits, each conversion circuit being configured for accepting the discrete-valued output signal of a corresponding mapping circuit to generate a respective one of the set of continuous-valued output.

Embodiments of this aspect may include one or more of the following features.

In some embodiments, the signal processing circuit is used in the context of memory applications, in which case the observation of the signal includes an observation of a physical state of a selected storage element of a storage array having a group of storage elements. Each one of the set of representative levels associated with the signal may correspond to a respective one of a set of physical states to which the storage element can be written.

A pre-processing circuit is coupled to the signal processing circuit for generating the discrete-valued input of the signal processing circuit characterizing the observation of physical state of the storage element.

The pre-processing circuit may include a read circuit for selecting the storage element from the group of storage elements to generate a discrete-valued signal representing the physical state of the selected storage element and for providing this discrete-valued signal as input to the signal processing circuit. Examples of such a read circuit include thresholding devices, such as a digital sense amplifier.

Alternatively, the pre-processing circuit may include a read circuit for selecting the storage element from the plurality of storage elements to generate a continuous-valued signal representing the physical state of the selected storage element. In some of these examples, the pre-processing circuit further includes an analog-to-digital converter for converting the continuous-valued signal representing the physical state of the storage element into a discrete-valued signal, and for providing this discrete-valued signal as input to the signal processing circuit.

In some embodiments, a decoder circuit is coupled to the signal processing circuit for processing the set of continuous-valued outputs of the signal processing circuit to generate a digital representation of the physical state of the storage element.

The decoder circuit may include an analog decoder core configured for, in each of a plurality of cycles of a decoding operation, accepting a portion of code data and a portion of an intermediate value date to generate an output. The decoder circuit may further include an analog storage for storing the output of the analog decoder core. In some examples, the portion of code data accepted in each of the plurality of cycles of the decoding operation includes data representing the physical state of each of a subset of two or more storage elements selected from the storage array.

In some embodiments, the modeling of the characteristics of the observation of the signal includes a modeling of an expected degree of variability in the observation of the signal.

Each one of the plurality of mapping circuits may form a substantially piece-wise linear mapping of the different range of the discrete-valued input to the respective discrete-valued output signals. The mapping circuit may be implemented as a look-up table, or alternatively, as one or more logic gates.

Each conversion circuit in the signal mapping circuit includes a digital-to-analog converter.

Some embodiments may have one or more of the following advantages.

In some embodiments, storage devices with "soft" error correction functionality that makes use of information about the statistical reliability of the data can achieve better error detection and correction performance than devices with "hard" decoding in which data is mapped to discrete values. This reliability information can be represented either in digital form by allocating several bits for each transmitted data bit, or alternatively, in analog form by using a continuously valued analog signal (e.g., a current or voltage encoded signal).

In some embodiments, a soft demapper circuit is used for translating an ambiguous noisy version of an information signal to the reliability measure of this signal. Reliability metric can be chosen in different ways, including for example, probability based metrics and log likelihood ratio based metrics. The soft demapper can be designed to accommodate the specific noise characteristics of the storage device for the particular application, and may perform distinct mapping functions for read operation and write verify operations.

In some embodiments, implementing the soft error correction functionality on (or at least partially on) the same chip as the memory array can reduce the bandwidth requirement for transmitting data from the memory chip to the controller chip and result in lower power consumption.

In this document, signals representing "a degree of an association" (for instance, the degree of the association of the selected storage element with a different subset of one or more of the discrete set of physical states) include signals that provide a non-absolute measure, or a measure that is different from a mere binary decision of absolute association (true) or absolute non-association (false). Such signals may be continuous-valued signals, for instance, having levels corresponding to numerical values within the range of (0, 1) (non-inclusive), or be signals that have levels corresponding to a gradation of a range of numerical values that results in multiple quantized progressions. In some implementations, the degree of an association is presented by the signal as a probability representation in a linear domain (e.g., linear probabilities), a probability representations in a logarithmic domain (e.g., log odds, log likelihood ratios), or representations of certainty or likelihood that are not strictly probabilistic.

Other features and advantages of the invention are apparent from the following description, and from the claims.

BRIEF DESCRIPTION OF DRAWINGS

FIG. 11 shows an example of a PAM8 Gray-coded constellation used in the memory device of FIG. 10.

FIG. 15 shows a mapping table for use with one digital shuffler of FIG. 14.

DETAILED DESCRIPTION

1 Overview

Data storage and retrieval in a memory device are subject to errors, for example, due to fabrication defects, device aging, circuit uncertainties, and chip variations. Many of these error sources can be characterized as a type of noise that affects the reliability of the information being stored in and retrieved from the memory. An analogy to the noise is a communication channel that imposes distortion to the message being transmitted through the channel. Traditional approaches to error handling (e.g., error detection, reduction, and correction) in memory devices include storing information by programming codewords, for example, developed using ECC techniques, to memory cells. The stored information can be retrieved by detecting the programmed codewords in the form of a bit stream and subsequently "hard" decoding the bit stream to form a read output.

The following description discusses approaches to handling errors in storage devices based on the soft processing of information (e.g., not solely based on discrete values) from the memory. By modeling the characteristics of storage devices including the characteristics of various noise components that may influence the memory performance, soft error reduction/correction can be implemented to translate a noisy observation of stored data into a reliability measure of the observation that contribute to an accurate data recovery.

For purposes of illustration, the following description provides examples of soft error reduction/correction techniques primarily in the context of a flash memory. It should be noted that these techniques are readily applicable to other types of storage devices such as DRAM, SRAM, phase-change memories, hard drives, and various types of multi-level ($\geq 2$ levels) memories.

Figure 3:
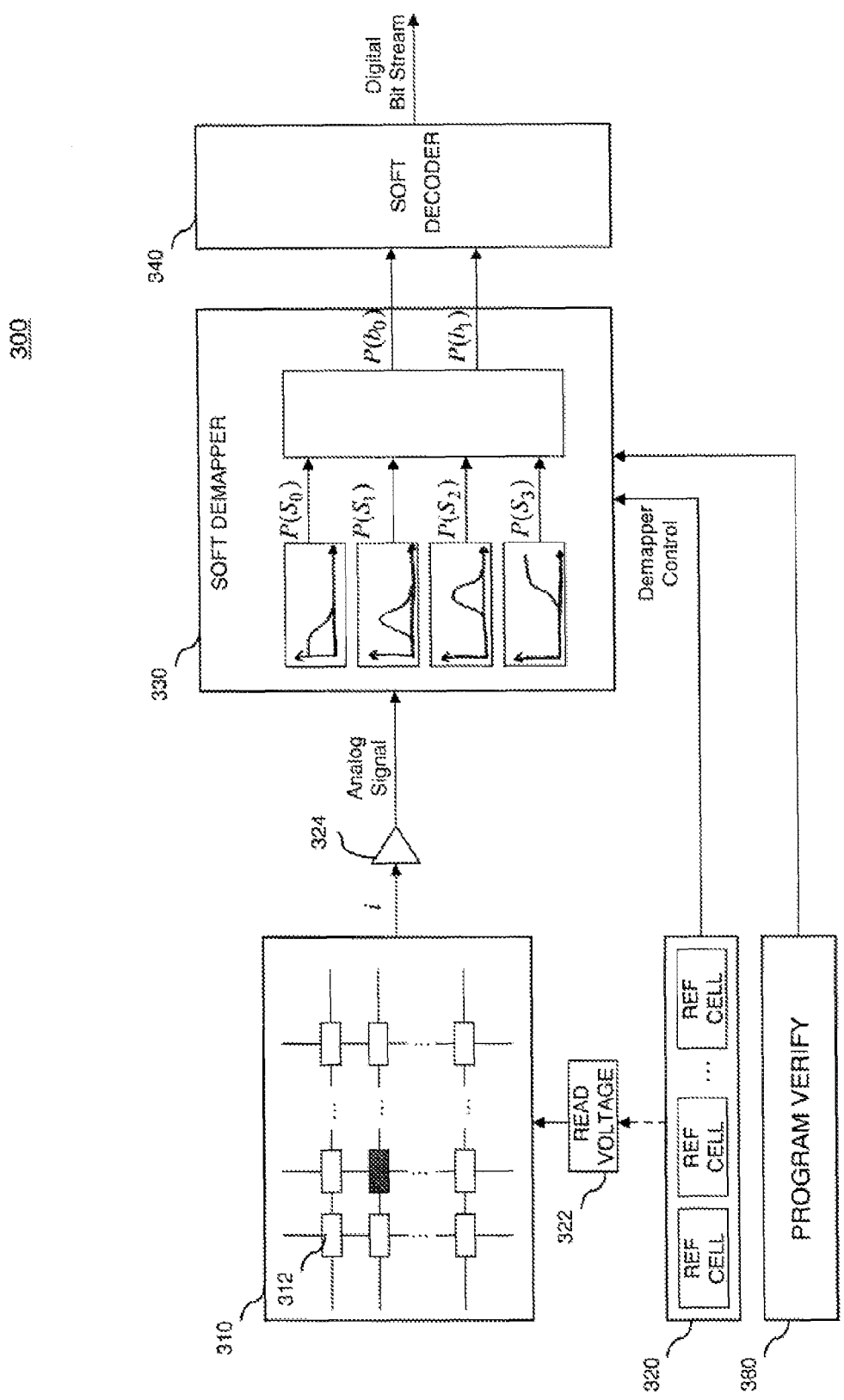
FIG. 3 shows one example of a memory device with soft error handling capability.

Referring to FIG. 3, a flash memory device 300 includes a memory array 310 having a set of memory cells 312 arranged in columns and rows. In this example, for purposes of discussion, each cell is assumed to store 2 bits of information. In other words, each cell can be programmed to 4 possible logic states (denoted as $S_0, S_1, S_2, S_3$), with each state defined by a different threshold voltage $V_{TH}$ created by injecting a corresponding amount of charge to the FG of the cell. Depending on the particular application, the 2-digit bit string stored to a memory cell may represent the information bits (referred to as an original message) or a portion of the information bits, or alternatively, represent a codeword (referred to as an encoded message) that contains redundancy (e.g., parity bit(s)) or a portion of the codeword.

Figure 1:
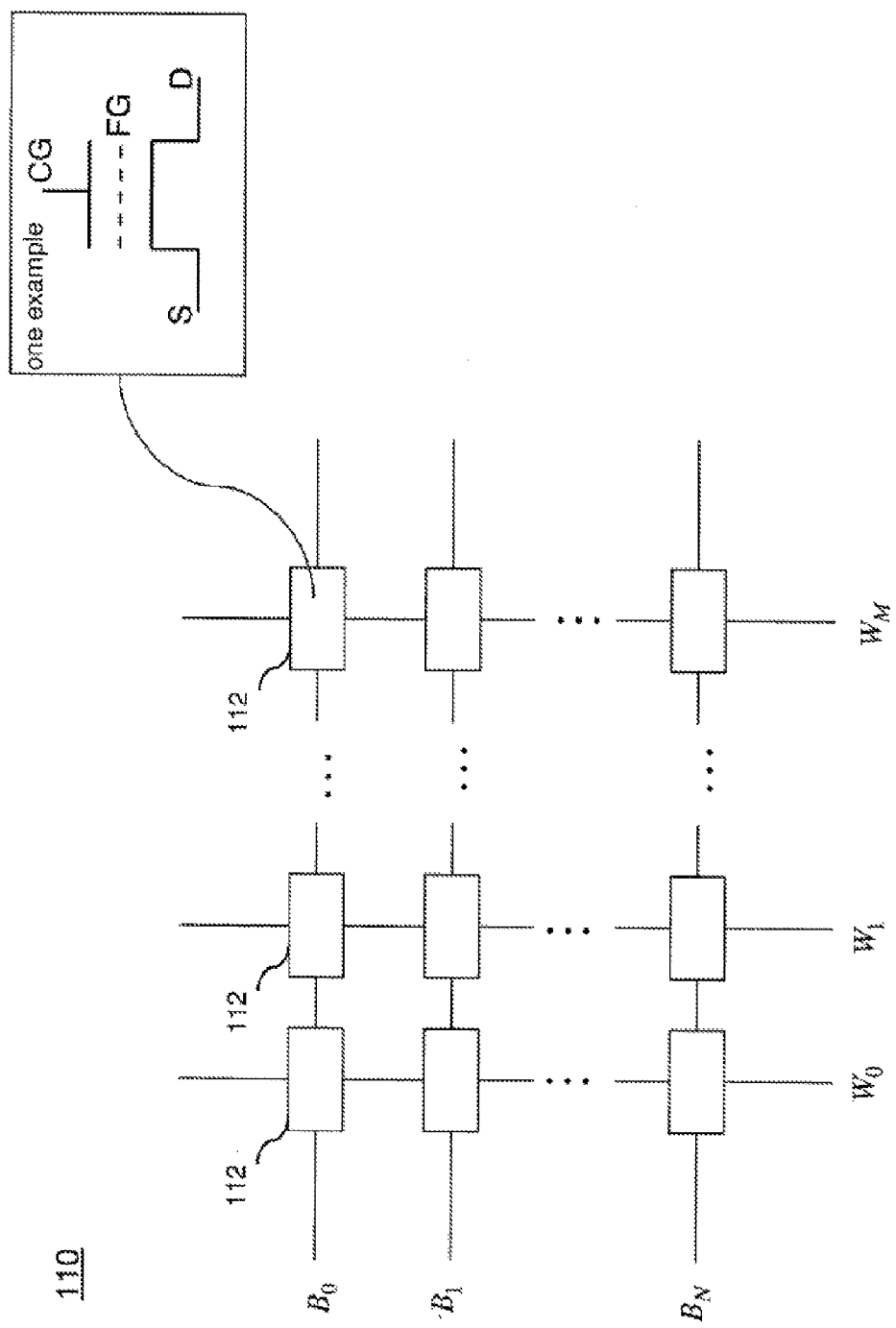
FIG. 1 shows a memory array in an exemplary memory device.
Figure 2:
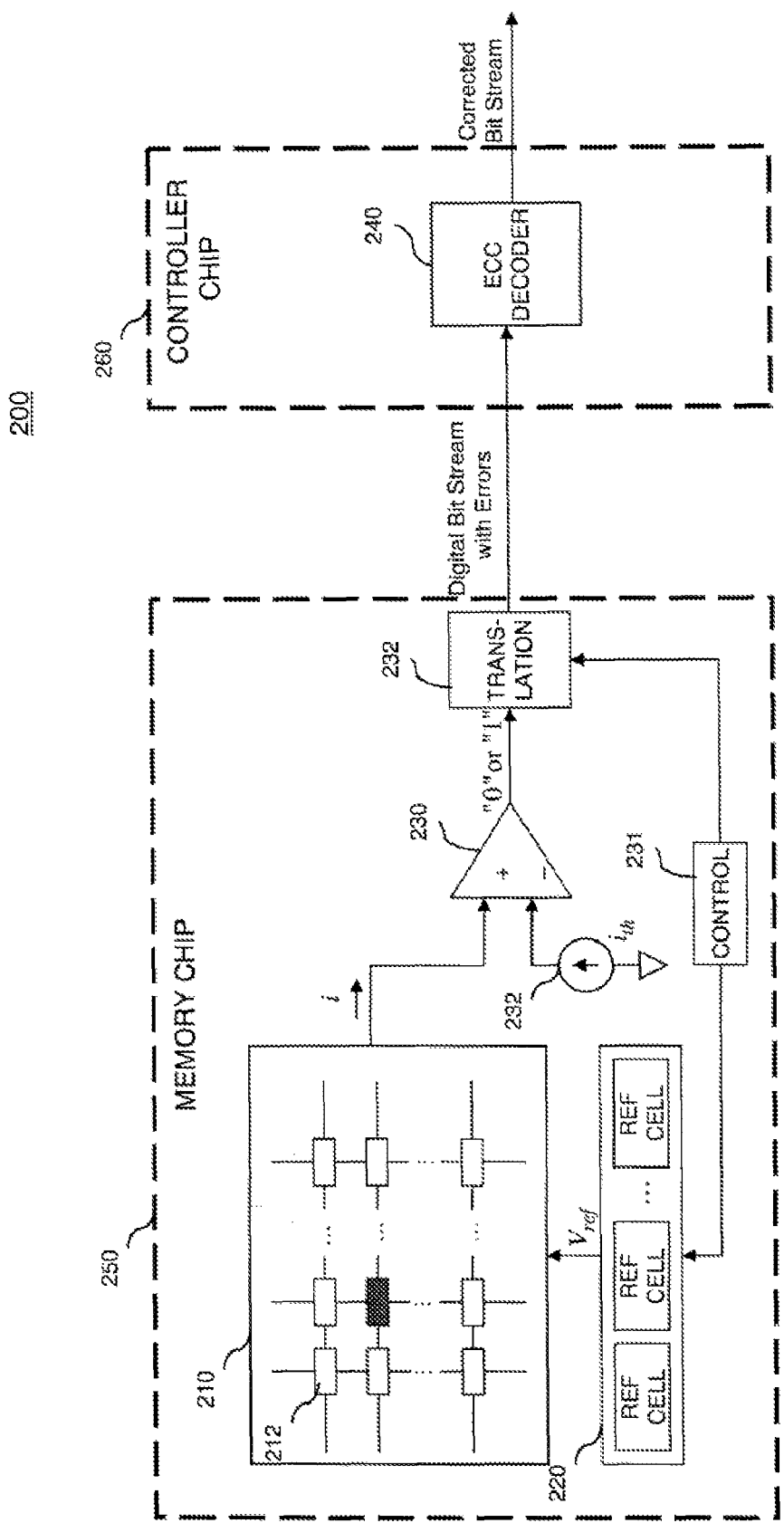
FIG. 2 shows a conventional memory device with error correction scheme.

To read a selected memory cell, a read voltage 322 is applied to the CG of the cell to induce an analog signal indicative of the cell's threshold voltage (or in other words, the cell's logic state). In some implementations, this analog signal is selected to be one that presents a continuous function of the cell's threshold voltage, with amplitude spanning over one or more continuous ranges. This is different from the example of FIG. 2 where the readout signal from a cell is a discrete function of its threshold voltage, which simply makes a "yes" or "no" decision for each one of the reference voltages applied to the cell.

One example of the induced analog signal of FIG. 3 is the source-drain current of the cell, and in this example, the read voltage 322 is provided with a fixed amplitude equal to or greater than the reference voltage needed to overcome the possible threshold voltages of the cell for any state that may have been written. This read voltage 322 is designed to be capable of inducing, regardless of the logic state to which the cell is programmed, the source-drain current i reflective of the threshold voltage according to the cell's I-V characteristics. For example, in cases where the flash memory cell is formed using MOS transistor operating in the weak inversion regime, the current is formed approximately as $i \propto e^{(V_{READ}-V_{TH})}$; whereas in other cases of MOS operating in the strong inversion regime, the current is formed approximately as $i \propto (V_{READ}-V_{TH})^2$. Other types of current-voltage characteristics (e.g., near linear I-V characteristic) are also possible depending on the particular implementation of the memory cells. In some examples, the current signal is processed in a signal converter 324 that is configured to amplify the current signal i and/or to convert it to a voltage signal using a resistive load. In some examples, the signal converter 324 includes a low noise amplifier (LNA) for amplifying the current signal and/or for reducing noise non-uniformity in the signal.

Ideally, when the entire memory device (including the read and program circuits) is error-free, the analog signal induced from any of the memory cells in this example would have only 4 possible values, each corresponding to a respective logic state. In practice, the analog signal may span over a continuous range of values, for example, due to the programming process and the noises from other circuit components of the memory device. Therefore, the determination of the logic state (and thus the bit string) of the cell given the detected analog signal is probabilistic in nature.

One approach to implementing soft error correction on the induced analog signal includes the use of a soft demapper circuit 330 as described in detail below.

Very generally, the soft demapper 330 accepts the analog signal as input and transforms it into a reliability measure of this signal. The reliability measure can take various forms, with one example being a probability based measure of the selected memory cell being at each one of the 4 possible logic states and another example being a log likelihood ratio (LLR) based measure. The soft demapper may additionally or alternatively form a probability and/or LLR measure of each one of the two bits stored in the cell being a "0" or "1."

In this example, the soft demapper 330 uses its input signal to generate the probabilities of cell being in each one of the four possible states $S_0, S_1, S_2, S_3$. For each state $S_i$, the demapper is configured to form a respective transfer function, for example, as represented by a probability curve $P(S_i)$ conditioned on the input signal. The transfer functions are designed, for example, by modeling the characteristics of the memory device (including its noise components). In this example, at any input value, the probabilities of all four states are normalized so that they add up to 100%. (Normalization is not necessarily required in other examples, where the probabilities of all states may not add up to 1.) The probability of one of the bits stored in the cell having value "1", i.e., $P(b_0)$ or $P(b_1)$, can be obtained, for example, by performing a marginal sum over a selected set of $P(S_i)$ determined according to the mapping of the states to the bit strings. Further discussions of circuit examples and techniques to implement the soft demapper 330 are provided in detail in U.S. Patent Application Ser. No. 61/156,721, titled "Signal Mapping," filed Mar. 2, 2009, the entire contents of which are incorporated herein by reference.

In some examples, the outputs of the demapper 330 are further processed by a soft decoder 340 (e.g., a soft error correction decoder) to generate a digital bit string representing the stored data in the selected memory cell. For example, the soft decoder 340 converts the probabilities of the states $P(S_i)$ or the probability of the bits $P(b_i)$ to form a decoded bit string associated with the memory cell. In examples where code words (e.g., including both information bits and parity bits) were written to the memory cells, the soft decoder 340 makes use of the ECC to recover the information bits. Further discussions of circuit examples and techniques to implement the soft decoder 340 are provided in detail in U.S. Patent Application Ser. No. 61/156,792, titled "Belief Propagation Processor," filed Mar. 2, 2009, the entire contents of which are incorporated herein by reference.

In the above soft error correction approach, the soft demapper circuit 330 forms a mapping of a continuous analog signal to the reliability measure of the signal. Note that the ideal characteristics of this mapping (e.g., the shapes and the locations of the probability curves) are dependent on the characteristics of the memory device, such as the operation state of the device, the chip organization, and error distributions along the signal path. In some examples, the error tolerance in different operations (e.g., read, write, verify) may be different. Moreover, the memory cells fabricated on the same chip may not always have uniform properties, for example, with some being more error-prone than the others.

In some implementations, the soft demapper 330 is designed to be capable of reconfiguring its mapping characteristics, for example, based on the type of the circuit operation the memory device performs and the characteristics of the signal path.

The following description provides two examples in which the soft demapper 330 is operable to adjust its mapping characteristics using an external control. The first example relates to performing a read operation on selected memory cells. The second example relates to verifying a write operation on selected memory cells.

2 Read Operation

Figure 4:
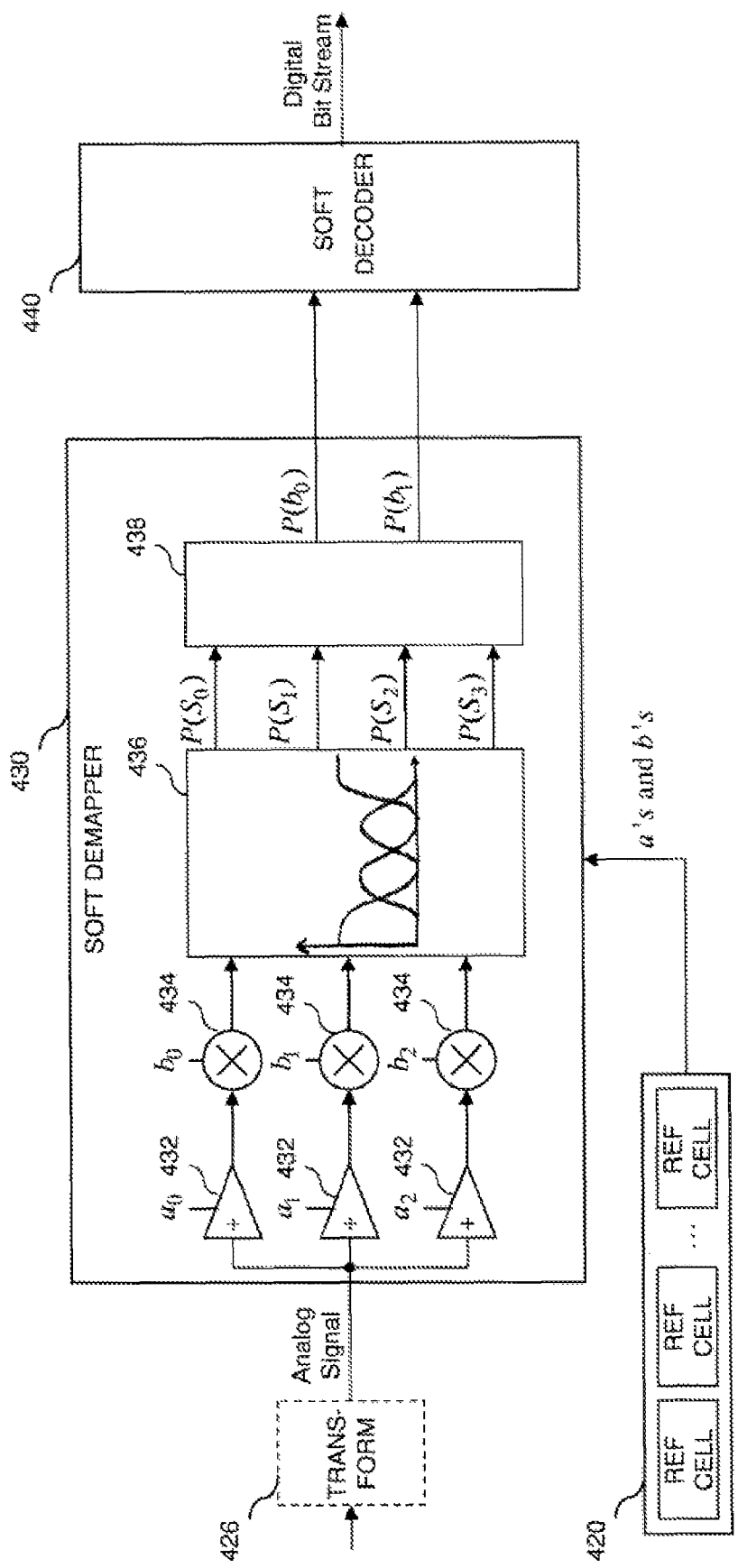
FIG. 4 shows the memory device of FIG. 3 in a read operation.

Referring to FIG. 4, in one implementation, a soft demapper circuit 430 uses a set of sigmoid generators 436 to provide transfer functions that approximate the probability curves $P(S_i)$. The sigmoid generators 436 are coupled to a set of pre-processing components 432 and 434 that are responsive to external control signals $a_0, a_1, a_2$ and $b_0, b_1, b_2$ for controlling the characteristics of the transfer function of the demapper. Examples of controllable characteristics of the transfer function include the locations and the shapes (e.g., sharpness) of the probability curves $P(S_i)$.

In a read operation, some or all of the $a_k$ and $b_k$ parameters may be determined from values obtained from the reference cells 420. The reference cells 420 may include reference cells that respectively carry global control parameters and local control parameters, as described below.

At the global level, each cell can be programmed into four possible logic states, and the location of the probability curve $P(S_i)$ for each state is defined (or at least partially defined) by the representative threshold voltage of the state. These representative threshold voltages may be provided by a set of global reference cells to the demapper to set mapping parameters that are universally applied to all read operations. Note that the spacing between the different probability curves is not necessarily uniform and the sharpness of each curve may also differ. This can be caused, for example, by the different noise levels incurred by the transmission of the analog signal in different amplitude bands as corresponding to the different states. In some examples, such variabilities can be accounted for during the read operation by setting the desired control parameters to the demapper to generate a set of non-uniformly spaced transfer functions $P(S_i)$. In some other examples, an optional signal transformation circuit 426 precedes the soft demapper circuit 430 to provide a fixed or programmable transfer function, for example, that transforms the analog signal such that the transformed signal can be subsequently processed using a soft demapper with a set of uniformly spaced transfer functions $P(S_i)$. Such a signal transformation unit can be designed to account for, for example, the non-uniformity in the noise distribution for states $S_i$, the non-uniformity in the spacing between the states $S_i$, and/or the non-linearity of the current-voltage characteristics of the transistor in the memory cell.

At the local level, cell-to-cell variations may be present on a memory chip. For instance, certain blocks or rows of memory cells may exhibit noise characteristics different from the others, for example, as a result of the fabrication process or faster aging due to more frequent use. Therefore, in some applications, it is useful to implement a set of local reference cells carrying control parameters that are specific to subsets of one or more of the memory cells. When a particular memory cell is selected for a read operation, the corresponding local reference cell(s) is also selected to determine or adjust the parameters to reconfigure the mapping characteristics of soft demapper to suit this particular read operation.

Note that, for certain types of memory devices, the memory cells undergo an aging process that can cause the threshold voltages of the cell to gradually shift as a function of its accumulative use time. This can cause the read error rate to increase over time if the parameters used for mapping the signal to the reliability measure stay unchanged. To reduce this aging effect, in some applications, the demapper circuit is adapted to accept a set of time-varying control parameters based on the aging characteristics. One way of doing this is to re-write the reference cells with suitable reference voltages at the same time memory cells are written.

3 Verify Operation

In some applications, once a memory cell is written, it undergoes a verify operation that compares the data that was sent from a memory controller to be written into the memory (e.g., stored in the buffer of a write circuit), with the data that has actually been stored in the cell to check, for example, whether the programming operation is completed. One way to perform the verify operation makes use of a soft demapper circuit 530 configured using the above described techniques.

Figure 5:
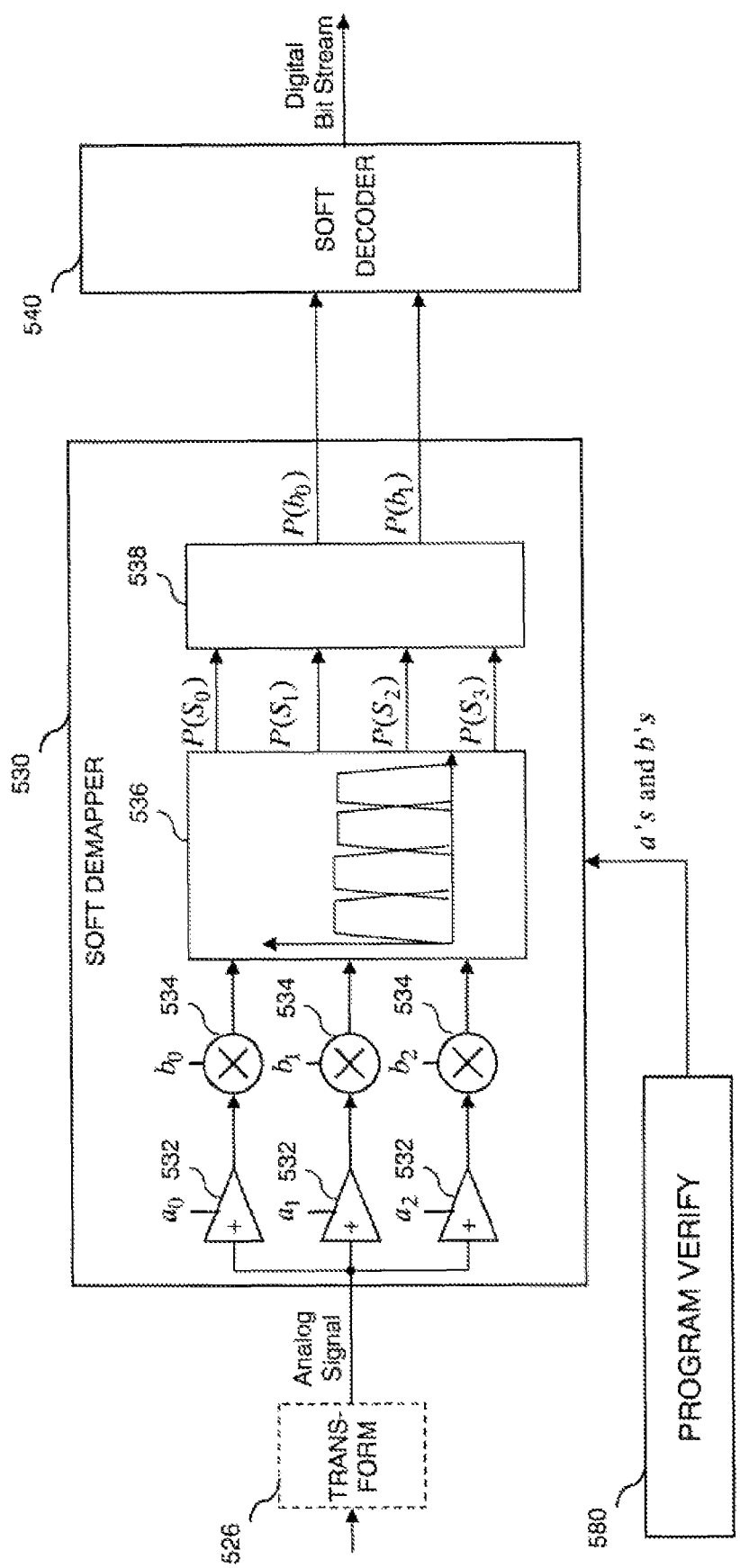
FIG. 5 shows the memory device of FIG. 3 in a verify operation.

Referring to FIG. 5, in a verify operation, the demapper 530 accepts control parameters sent from a program verify circuit 580 to provide mapping characteristics suitable for this operation. Similar to the demapper operation of FIG. 4, in this example, the demapper 530 is also operable to adjust the location and the shape of its transfer function based on $a_k$ and $b_k$ parameters. Note that, even for the same memory cell, the mapping characteristics used in a verify operation are not necessarily the same as that used in a read operation. In some examples, the soft demapper 530 is configured to form sharper probability curves with less overlapping (or no overlapping) in comparison to the soft demapper 430 in a read operation, for example, because the signal in the latter (but not the former) operation may contain aging-caused noise. The sharper probability curves may also be desirable in cases where, for example, each verify operation is performed along with a write operation during which incremental charges are injected in succession to the floating gate of the transistor in the memory cell, and after each injection, the demapper is used to determine whether the intended charge has been stored. In those cases, the demapper 530 can effectively function as a "hard" version of the demapper 430 of FIG. 4, producing near-discrete output after each charge injection. Depending on the particular implementation, the soft demapper 530 may also be responsive to local reference cells (not shown here) to provide mapping specificity to a particular memory cell(s) if desired.

4 Device Architecture

The above described circuits for soft error handling can be implemented in a memory device in a number of different ways. The demapper can be implemented using analog circuits and/or digital circuits. Similarly, the decoder can be implemented using analog circuits and/or digital circuits. In some examples, the decoder can include an analog processing module coupled to a digital processing module in a cascaded or parallel fashion. The locations of these circuit components can be determined based on factors such as the cost, the physical size, and the bit error rate performance desired for the overall solution.

Figure 6A:
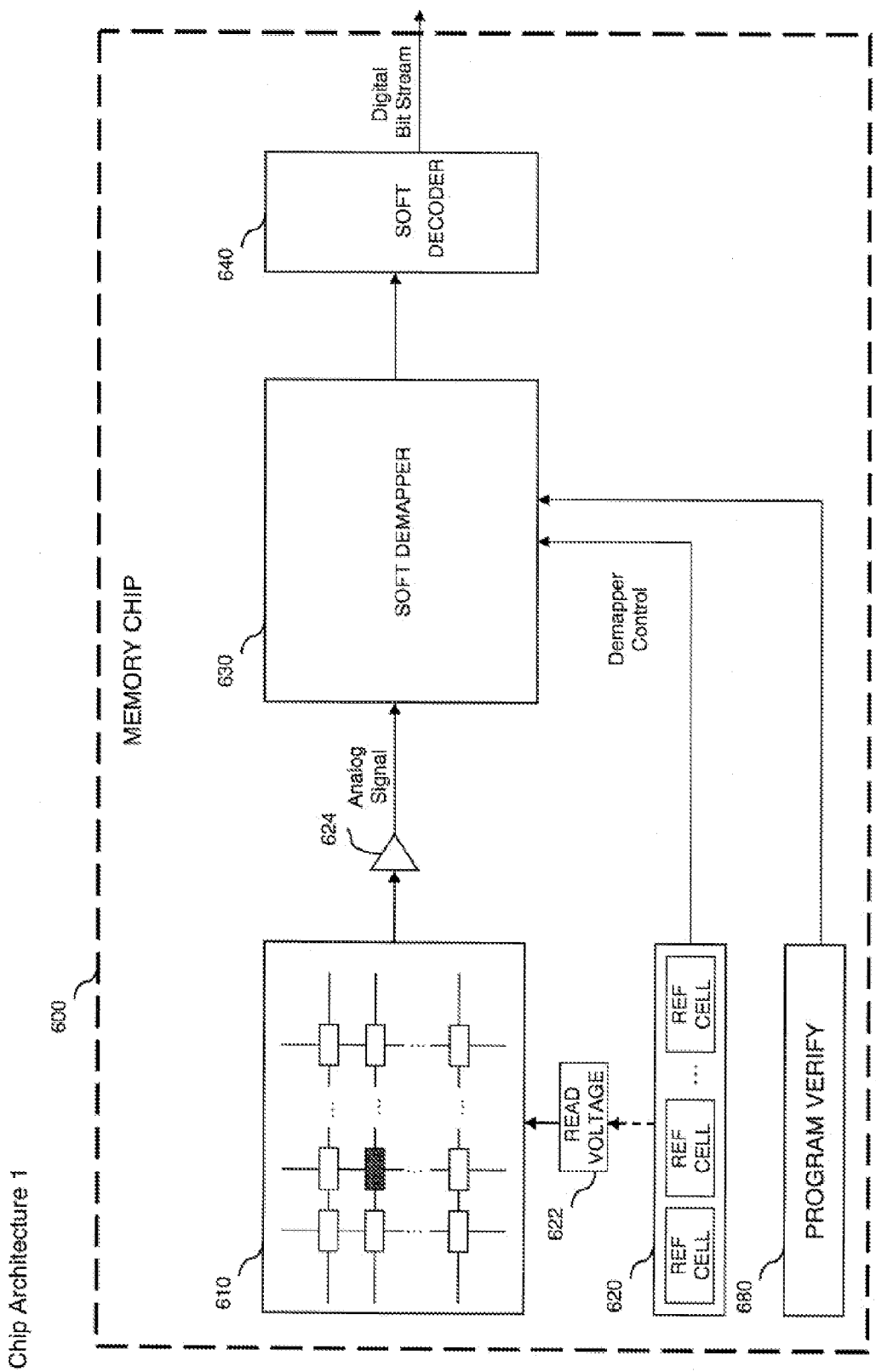
FIG. 6A shows a circuit architecture of the memory device of FIG. 3.

FIG. 6A shows an on-chip architecture in which both the soft demapper 630 and soft decoder 640 are placed on the same chip 600 as the memory array 610. In this case, the soft demapper 630 can reside in a variety of places on the chip, including but not restricted to directly next to a memory cell, at the end of a memory column or row, or elsewhere in the read path of the memory device.

Using this architecture, the soft demapper and the soft decoder can be formed either both using digital circuits, or alternatively, both using analog circuits. In the first case, the outputs of the demapper are provided in the digital form to the decoder. In the second case, the outputs of the demapper are provided in the analog form, and the overall implementation can reduce the requirements for physical area and power consumption, allowing for a comprehensive and economical ECC solution for memory devices. Also, the soft demapper can be formed using analog circuits and the decoder can be formed using a combination of analog and digital processing modules, in which case the outputs of the demapper are provided in the analog form to the analog processing module of the decoder. Other variations (such as combining an analog demapper with a digital decoder) are also possible.

In some analog implementations, the functional components of the soft demapper and soft decoder are constructed using bipolar junction transistors, or MOS transistors operating in the weak inversion region (the "below-threshold" mode). In some cases, the inherent speed limitations of MOS transistors operating in the weak inversion region may limit the maximum bandwidth achievable by the demapper/decoder circuit. In some other implementations, the demapper and decoder circuits are constructed using MOS transistors operating in the strong inversion region (the "above-threshold" mode), allowing high throughput for practical memory applications to be achieved at a reduced cost.

Note that the demapper 630 is shown in FIG. 6A as being implemented in a centralized fashion such that analog signals read from selected memory cells are processed in the demapper in a serial manner. In this case, as a group of memory cells are read to produce a set of current signals, these current signals can be processed successively in the soft demapper 630, for example, by using an analog multiplexer (not shown) that sequentially couples a selected one of the current signals to the input of the soft demapper 630.

In some other examples, the demapper function can be implemented in a distributed manner to allow parallel processing of the current signals from multiple memory cells. For example, some memory devices may have a set of demapper circuits, each specific to a subset of memory cells for mapping the analog signal induced from these cells to reliability measures. Each subset of cells is selected, for example, based on their common characteristics (such as being in the same row of the memory array), and the corresponding demapper may be placed local to those cells (such as at the end of the row). In some further examples, the memory device may include a set of shared demapper circuits that operate over a range of multiple subsets of memory cells, in which case a read operation may involve both parallel and serial processing of data in the demapper circuits.

Depending on the particular implementation, the decoder circuit 640 can also be configured to process data in a serial and/or parallel fashion. In some examples, an analog memory is provided between the soft demapper 630 and the soft decoder 640 for storing outputs of the soft demapper 630 and for providing inputs to the soft decoder 640 (or multiple processing modules of the soft decoder 640), which then processes code data in a full parallel or a scheduled manner. In some examples where the soft decoder 640 applies an iterative approach to decode its input data, a set of intermediate value data is produced in each iteration and is stored in an analog memory (either centralized or distributed in the decoder 640) for retrieval in subsequent iterations. In cases where each iteration further includes multiple operation cycles, data produced in each operation cycle may also be temporarily stored in the analog memory. Once the iterations are completed, data, including the intermediate value data from the analog memory, is then combined to form decoded data representing an error correction of the input data provided to the decoder. The output of the soft decoder can then be passed onto succeeding circuit(s) either in a serial and/or parallel fashion.

In some applications, the on-chip architecture of FIG. 6A avoids sending accurate analog values across chips to an external controller. In some examples, the on-chip architecture can also take advantage of the block access nature of the memory read process and allow the decoder to operate on a larger amount of data in parallel without necessarily requiring it to be serialized, transmitted and then parallelized, therefore speeding up the decoding process.

In some applications, the on-chip architecture also enables the memory device to correct error internally, thereby reducing the i/o bandwidth by requiring only message bits (but not parity bits) to be sent and by requiring only hard bits (but not soft bits) to be sent. It can also allow the designer of the memory device to tailor the decoder to fit the exact design of the memory system, including for example, how the read function is affected by process, voltage, temperature, and other factors, by using the designer's knowledge of the strengths and weakness of the particular application.

Figure 6B:
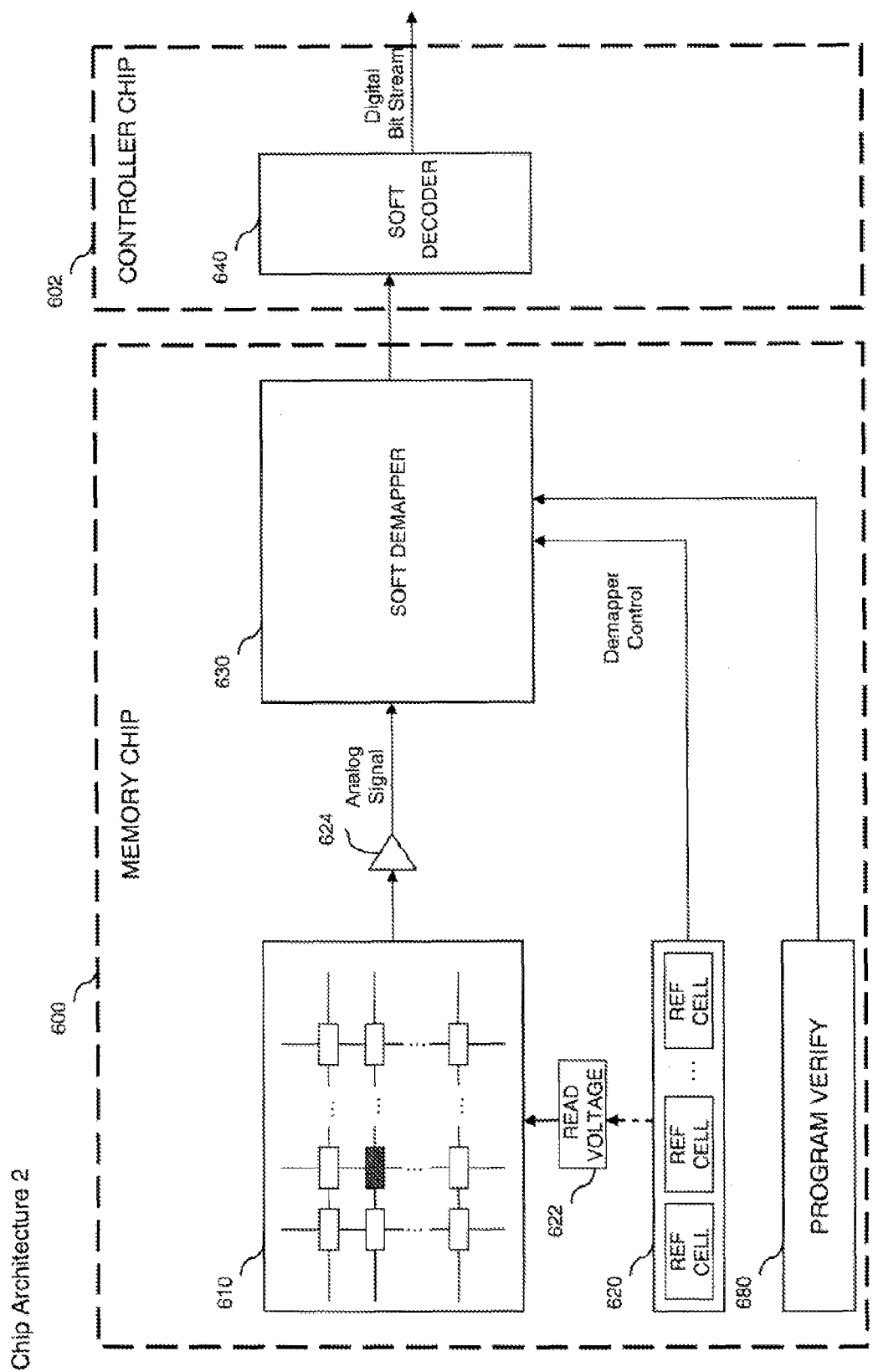
FIG. 6B shows a second circuit architecture of the memory device of FIG. 3.

FIG. 6B shows a second architecture in which the soft demapper 630 resides on the same memory chip 600 as the memory array 610, whereas the soft decoder 640 resides on a separate controller chip 602. In this case, the soft outputs of the demapper 630 are transmitted across chip to the decoder 640. Again, both the demapper and decoder can be implemented using analog circuits and/or using digital circuits. In some cases where the decoder 640 includes an analog processing module coupled to a digital processing module, the analog processing module can reside on the memory chip 600 while the digital processing module resides on the controller chip 602, such that only hard (digital) bits need to be transmitted across the chips.

This second architecture can be useful in certain applications such as when the decoder uses large block size to achieve better performance. In communication systems, codes with larger block sizes are used extensively to achieve low bit error rates (BER). In memory applications, using large block lengths and soft decoding in the controller chip 602 can allow the ECC algorithm to achieve coding gain over the communication channel between the multiple memory chips and memory controller, thereby improving overall performance.

In general, the integration of the demapper on the memory chip in FIG. 6A and FIG. 6B allows the design of the overall memory system (e.g., silicon-based memories) to be optimized for particular applications by improving the speed of access, improving the decoding performance, and/or reducing power consumption.

Figure 6C:
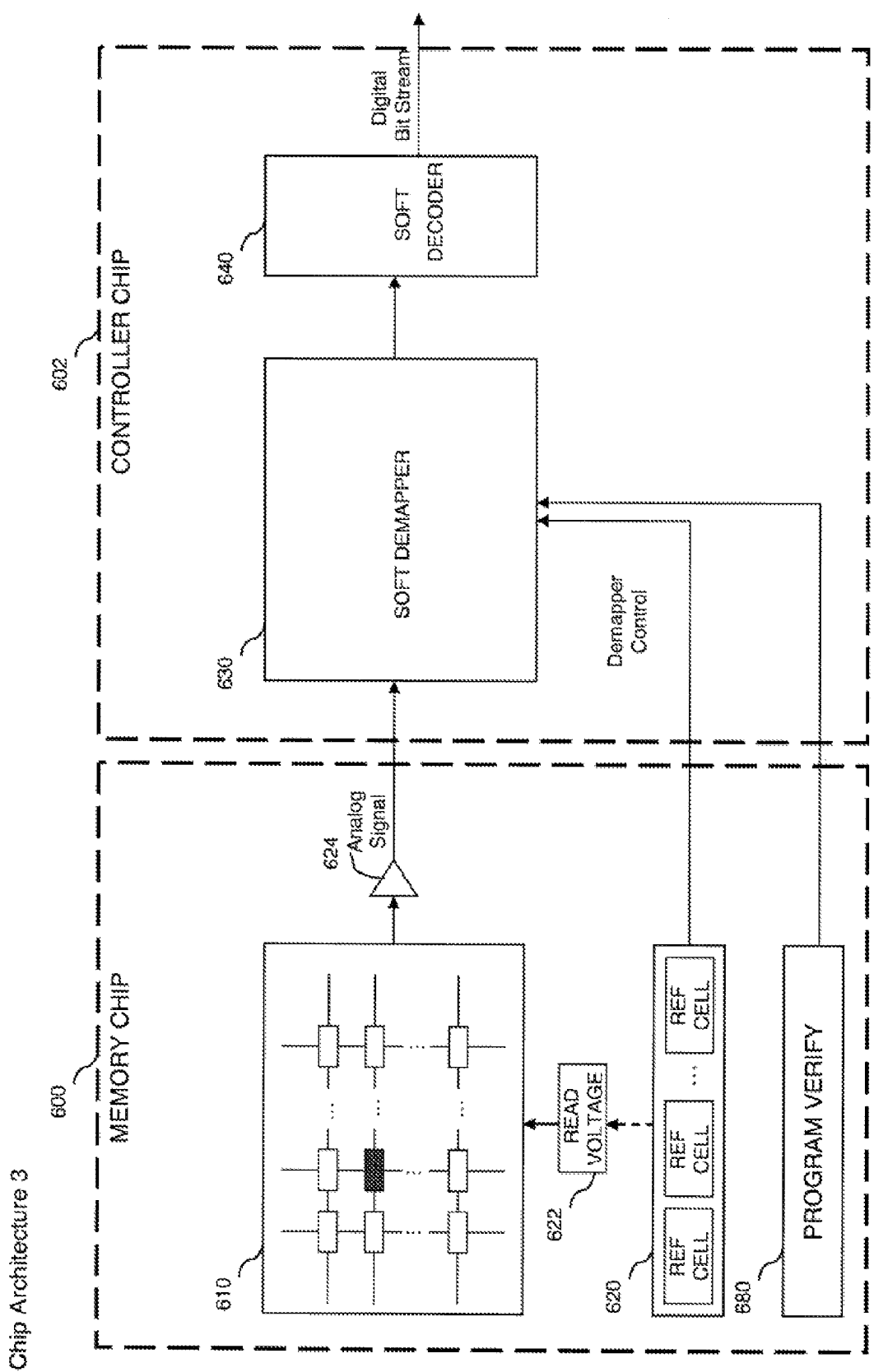
FIG. 6C shows a third circuit architecture of the memory device of FIG. 3.

FIG. 6C shows a third architecture in which both the soft demapper 630 and the soft decoder 640 reside on a controller chip 602 separate from the memory chip 600 on which the memory array 610 resides.

Note that the various parallel and serial implementations discussed with reference to the on-chip architecture can also be applied to the second and third chip architectures. Intermediate data storage (e.g., analog and/or digital memories) may also be used at selected locations of the chip.

5 Interfaces

As briefly described in the previous sections of this document, the memory device can be configured according to various memory architectures selected depending on the particular implementation. The individual components of the device may also be integrated via a variety of interfaces. Some examples of these interfaces are described in detail below.

Figure 9A:
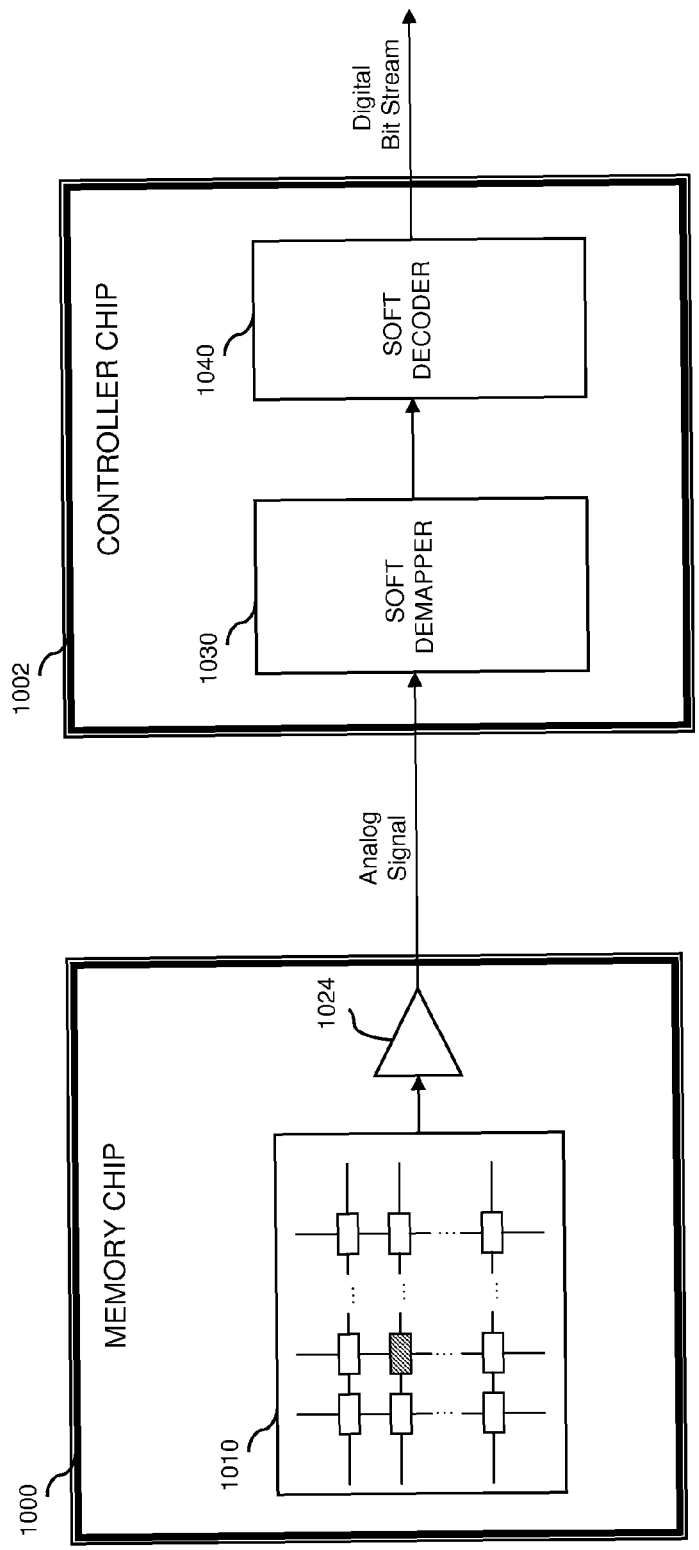
FIGS. 9A-9I show respective embodiments of interfaces between a memory chip and a controller chip.

FIG. 9A shows a first type of interface in which the memory device includes a memory chip 1000 and a controller chip 1002 on which both soft demapper 1030 and soft decoder 1040 are implemented. During a read operation, a read circuit 1024 (e.g., a sense amplifier) selectively accesses one or more cells in the memory array 1010 to form an analog signal representative of the storage value associated with the selected cell. This analog signal is transmitted in the form of a continuous-valued signal, for example, via conventional analog transmission mechanisms (such as via electrical or fiber-optic cables), to be processed by the soft demapper 1030 that is located on the separate controller chip 1002. Depending on the particular implementation, this signal can also be modulated prior to transmission using analog modulation method such as frequency modulation (FM) and amplitude modulation (AM), or no modulation at all.

Figure 9B:
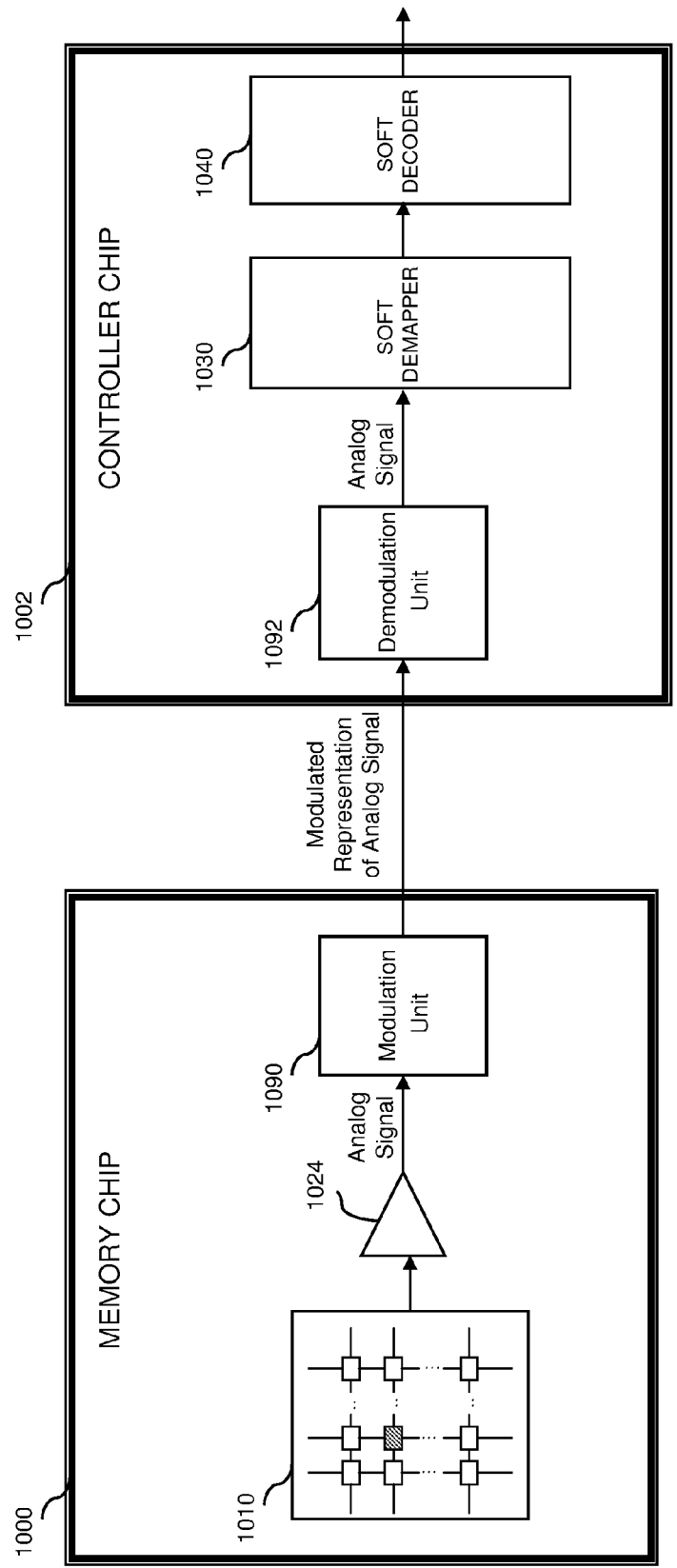

FIG. 9B shows another interface example in which the communication between the memory chip 1000 and the controller chip 1002 can be implemented in other forms (e.g., digital). Very generally, the memory chip 1000 includes a modulation unit 1090 (e.g., an analog to digital converter) that forms a modulated representation of the analog signal formed by the read circuit 1024. The output of the modulation unit 1090 may also be coded use different coding schemes, such as binary coding, Gray coding, or two's complement binary coding. This signal is then transmitted to the controller chip 1002, for example, via a digital transmission mechanism (as will be described in detail below). A demodulation unit 1092 (e.g., a digital to analog converter) subsequently processes the transmitted signal to form a recovered analog signal for use by the soft demapper 1030.

Figure 9C:
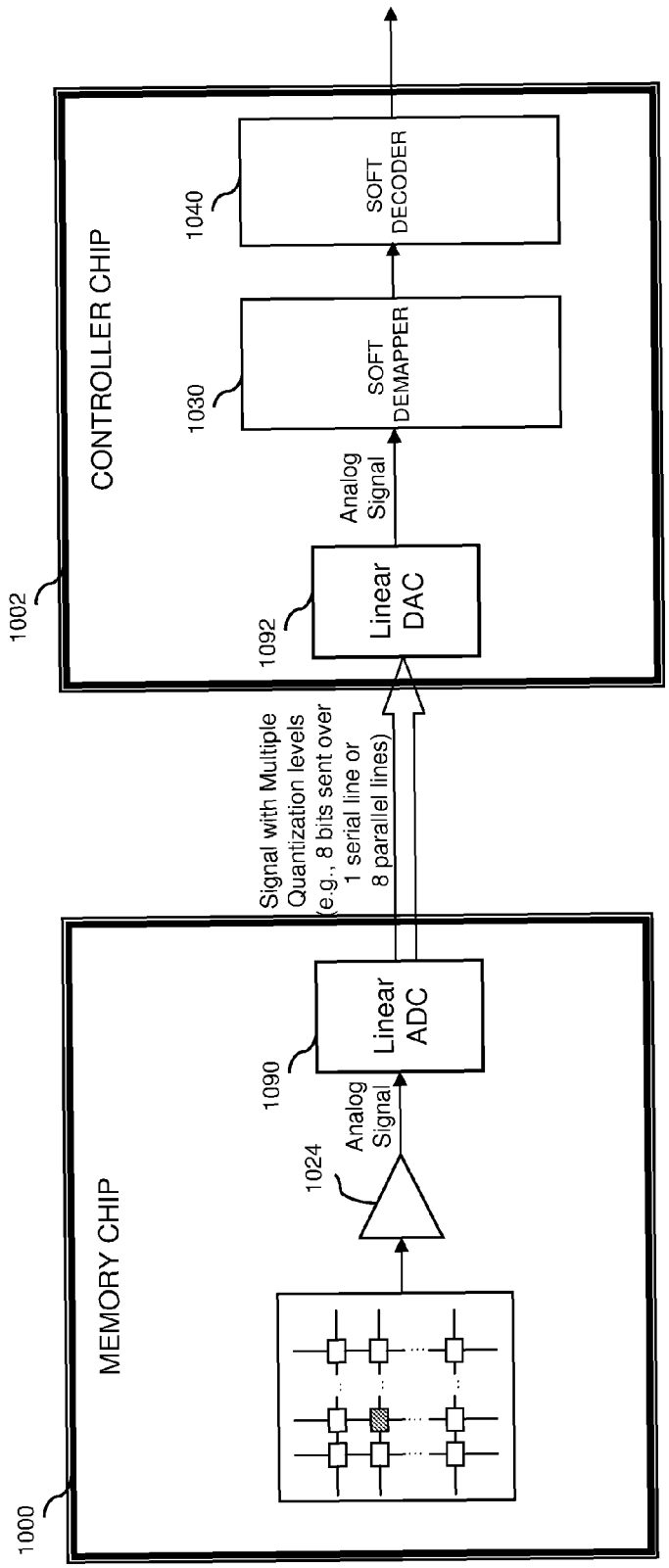

FIG. 9C shows one example of the modulation and demodulation units 1090 and 1092 and the transmission mechanism suitable for use in FIG. 9B. In this example, a linear analog-to-digital converter (ADC) is used to convert the analog signal into a signal of multiple quantization levels (e.g., as represented in a sequence of bits) according to a linear conversion scheme. This digital signal can be transmitted to the controller chip 1002 in serial or parallel fashion (e.g., 8 bits over one or more serial lines or 8 bits each over a respective parallel line).

Figure 9D:
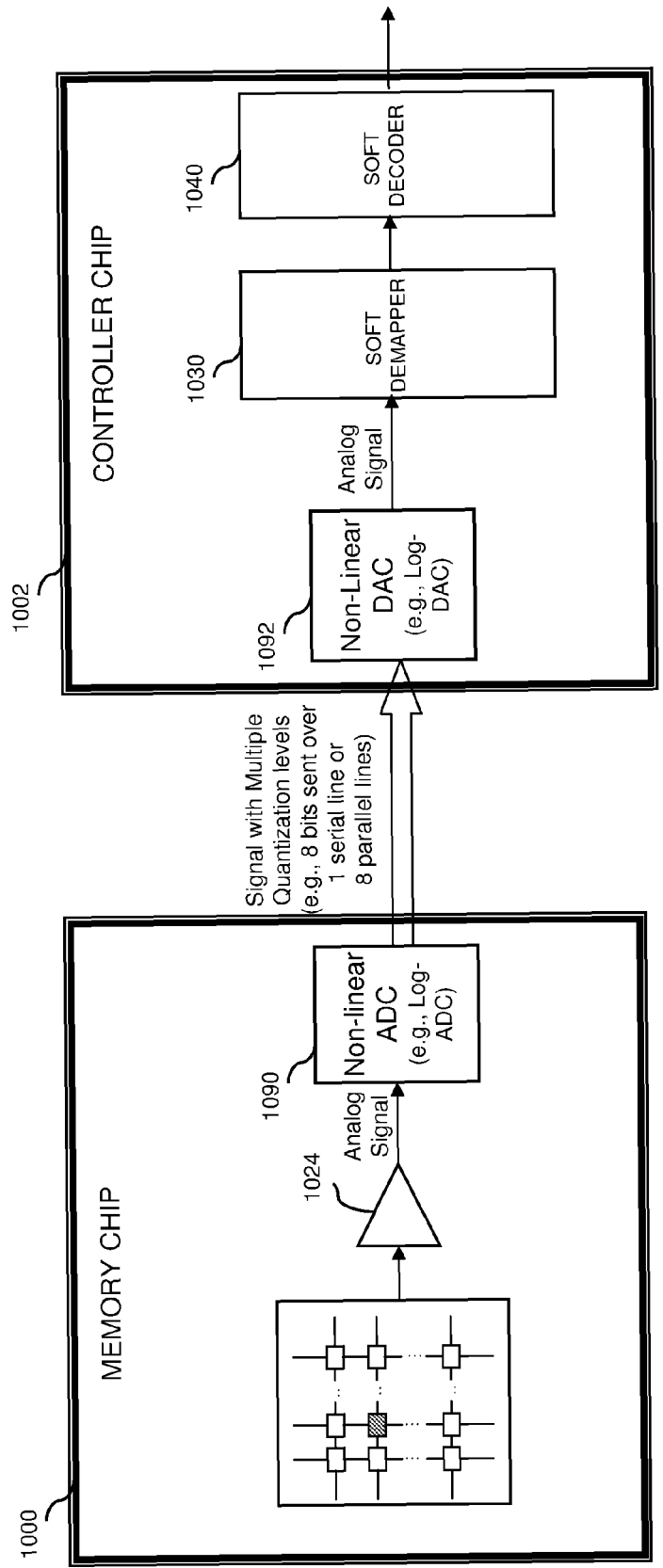

FIG. 9D shows another example of the modulation and demodulation units 1090 and 1092 and the transmission mechanism suitable for use in FIG. 9B. In this example, a non-linear analog-to-digital converter is used to convert the analog signal into a signal of multiple quantization levels. Non-linear ADCs can be useful, for example, in cases where the probability density function of a signal being digitized is not uniform and there are regions around certain signal levels that carry more information than regions around other signal levels. For example, for a voice signal with a Laplacian distribution, the region around the lowest amplitudes (i.e., near 0) contains more information than regions of higher amplitudes. Logarithmic ADCs can be useful in such cases as they can increase the dynamic range of representable values while enhancing resolution in the low-amplitude region.

Figure 9E:
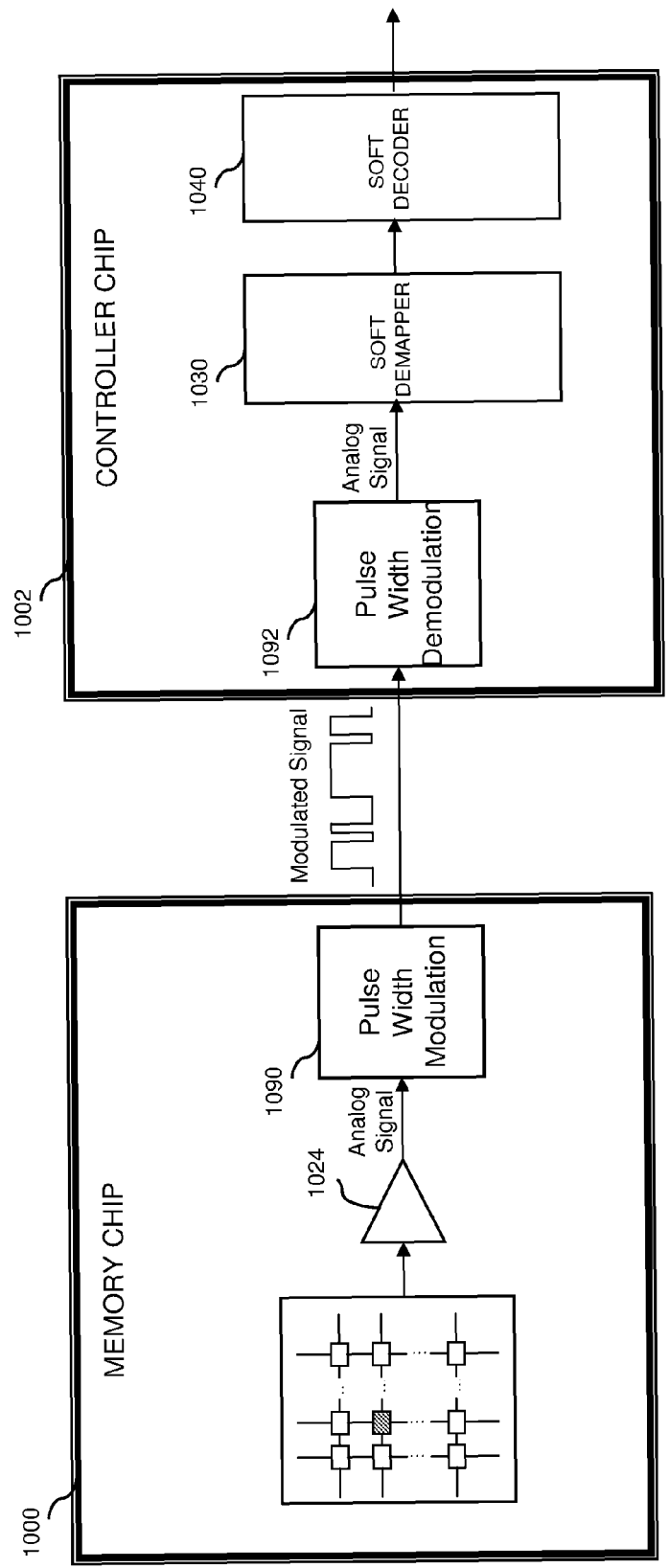

FIG. 9E shows another example in which pulse width modulation (PWM) techniques are used to form modulated signals to be transmitted to the controller chip. In some examples, the output of the read circuit 1024 is encoded in square waves whose time-average amplitude can be varied by modulating their pulse width (or duty cycle). For example, the widths of the pulses can correspond to specific data values that can be encoded at one end and decoded at the other. Pulses of various lengths can be sent at regular intervals (e.g., at the carrier frequency of the modulation), for example, as triggered by clock signals.

Figure 9F:
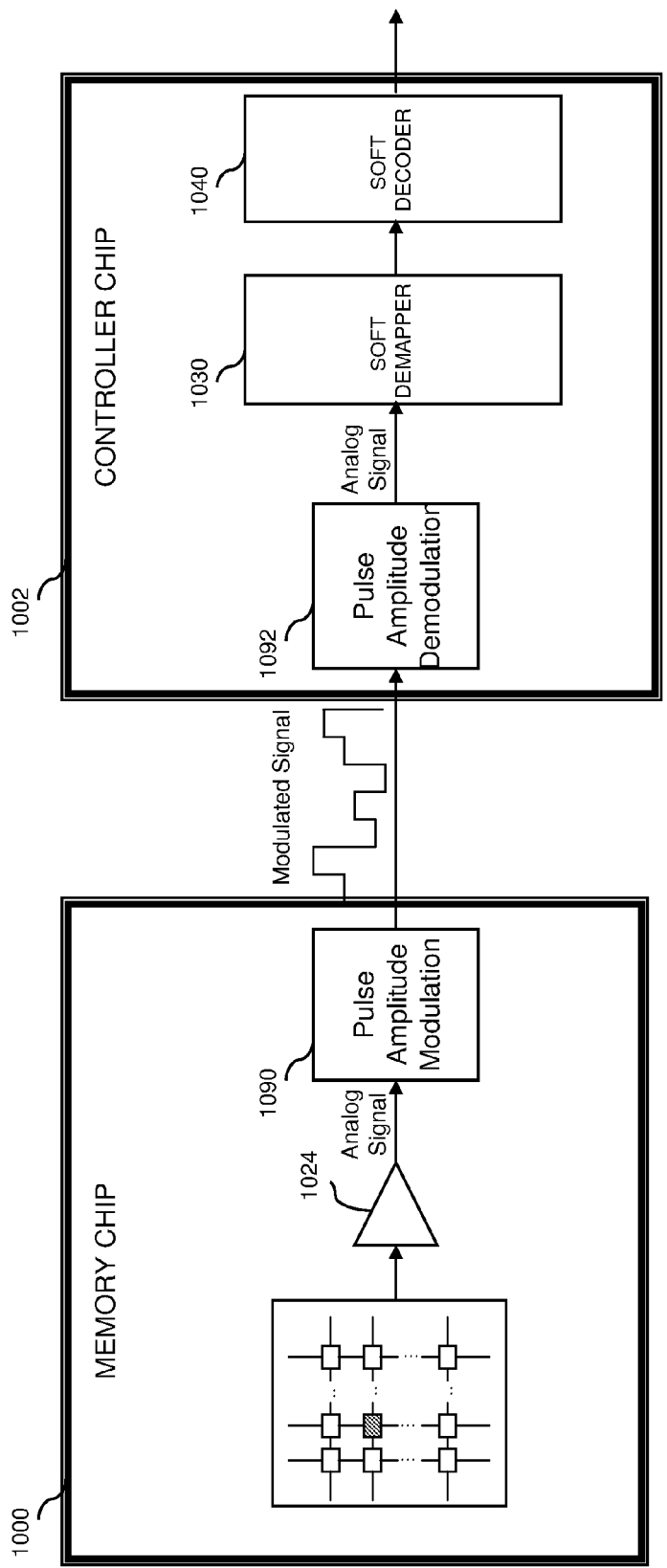

FIG. 9F shows another example in which pulse amplitude modulation (PAM) techniques are used. In this example, data is encoded in the amplitude of a series of signal pulses (e.g., a series of square or sinusoidal waves), transmitted to the controller chip, and then decoded by signal demodulation. Other forms of modulation may also be used, including for example, quadrature amplitude modulation (QAM) which uses a two-dimensional constellation, phase modulation (PM) which can represent information in the instantaneous phase of a carrier wave, pulse-position modulation (PPM) which can transmit information in a set of possible time-shifts, and other existing modulation techniques.

Figure 9G:
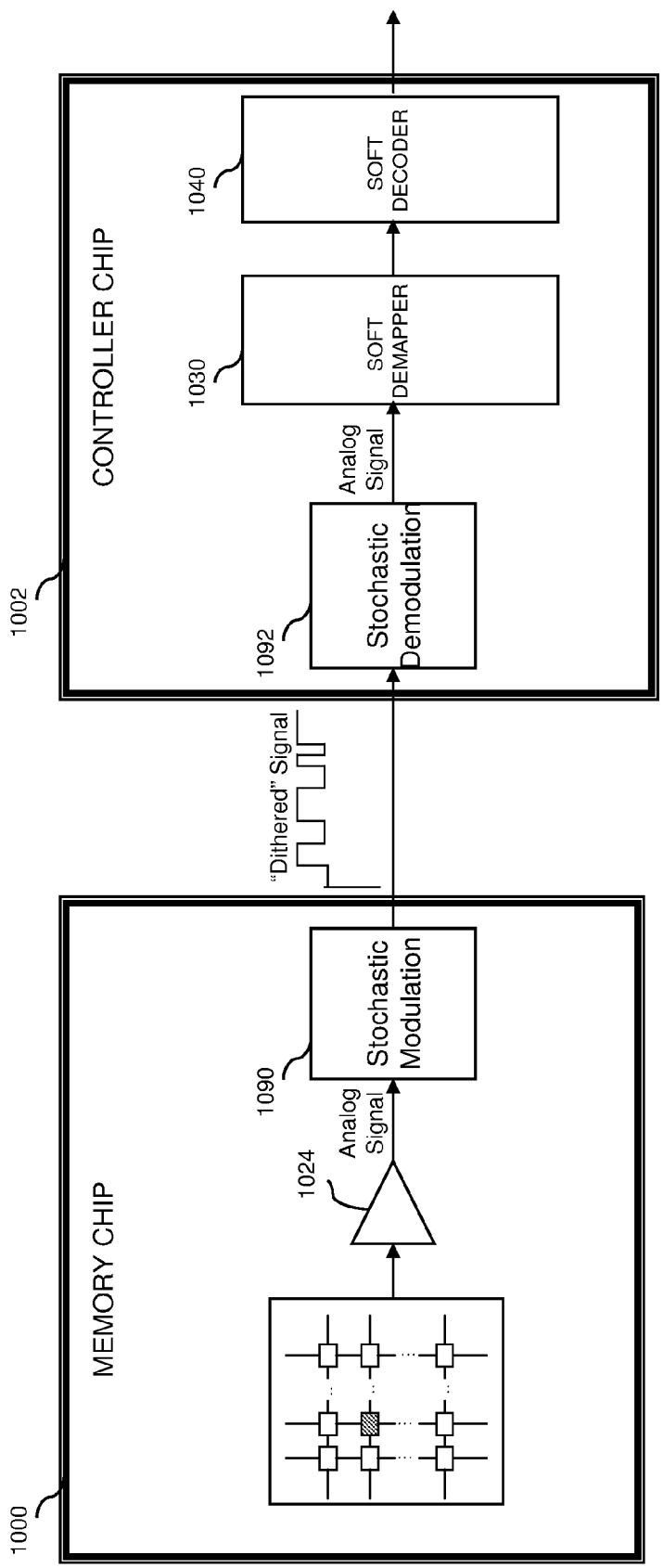

FIG. 9G shows a further example in which stochastic modulation techniques are used to form modulated signals to be transmitted to the controller chip. In this example, the analog signal can be encoded in random (e.g., pseudo-random) binary (or m-ary) sequences of a specified probabilistic distribution, for example, with the mean of the probabilistic distribution corresponding to the level of the analog signal to be transmitted. These random binary or m-ary sequences can be generated, for example, by "dithering" one or more digits of the sequence between discrete states (e.g., 0 and 1).

Figure 9H:
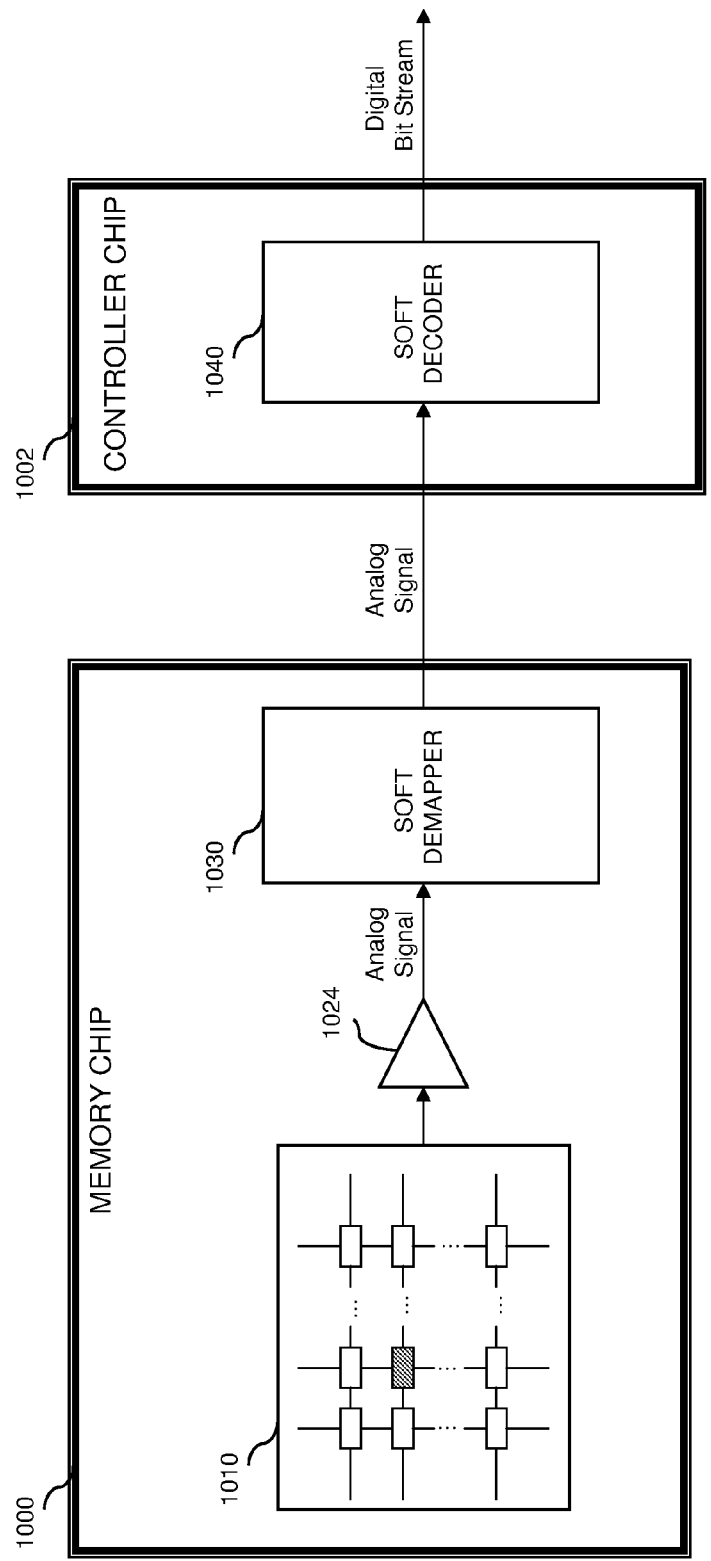

FIG. 9H shows a second type of interface examples in which the soft demapper 1030 and the soft decoder 1040 are separately implemented on the memory chip 1000 and the controller chip 1002. In this particular example, the output of the soft demapper 1030 is transmitted in the form of an analog signal to be received by the soft decoder 1040. Examples of analog transmission mechanisms includes the ones described above with reference to FIG. 9A.

Figure 9I:
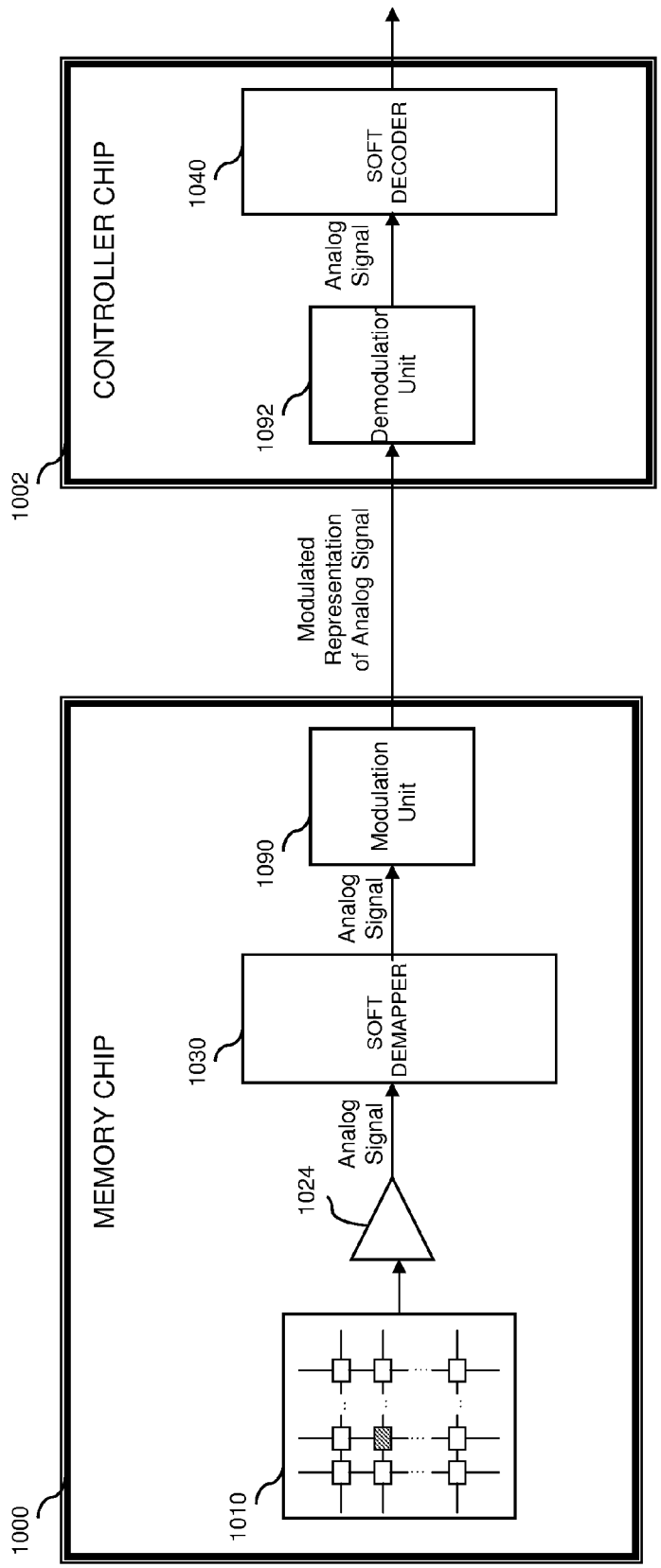

FIG. 9I shows another example in which the output of the soft demapper 1030 is transmitted to the soft decoder 1040 in modulated forms by use of modulation and demodulation units 1090 and 1092. Here, the modulation and demodulation units 1090 and 1092 can be implemented using the examples previously described with reference to FIG. 9C-9G.

In some other examples, the soft demapper and/or soft decoder described in this document can be used in conjunction with other memory chip technologies that do not necessarily read memory values in the analog form. For instance, some existing memory chips may have a digital sense amplifier that produces digital signals representing the memory values during a read operation. Such signals may be first converted by a DAC into the analog form, which can then be provided to the soft demapper and soft decoder described herein for subsequent processing.

Note that the use of the above-described interface examples is not limited to memory devices. More generally, these examples can be applied in various types of volatile and non-volatile storage devices, including for example, hard drives and phase-change memories. Also, some of these examples may be used in applications outside the memory context, for example, in a soft decoder in which there is a need for passing information among various circuit nodes in the form of a modulated signal.

6 Alternative Demapper Design

In one or more examples of the interfaces described above, the soft demapper 1030 is configured to receive an analog signal as its input to generate an output representing a reliability measure of the received signal. The input to the soft demapper 1030 contains "soft" information and may be provided in the form of a continuous-valued signal, for example, generated by the demodulation unit 1092 of FIG. 9B or by the read circuit 1024 of FIG. 9H.

Note that a continuous-valued input is not necessarily required in every embodiment of the soft demapper 1030. In some embodiments, soft information is accepted in digital form to produce output signals. In some of the aforementioned interface examples in which the soft demapper locates on a controller chip separate from the memory chip, signals representing soft information obtained from the memory chip are indeed transmitted in digital form to the controller chip. In at least some of those cases, implementing a soft demapper 1030 capable of accepting and processing digital input signals can be useful. In some of the single-chip configurations where both the demapper and decoder are placed on the memory chip rather than on a controller chip, implementing such a soft demapper 1030 may also be useful (for instance, in the case that a digital sense amplifier is used to generate digital signals representing the storage values of memory cells, these digital signals can be directly processed by the soft demapper without D-to-A conversion.)

Figure 10:
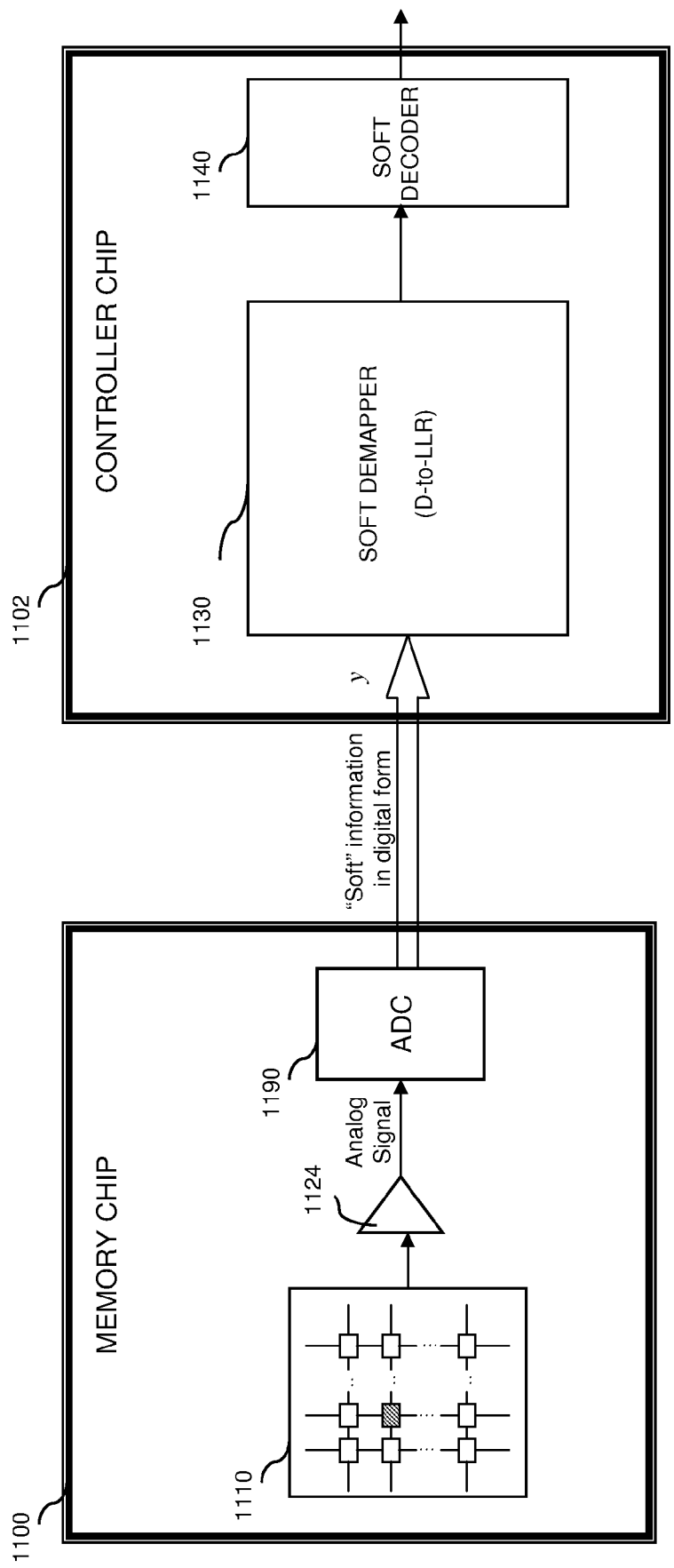
FIG. 10 shows a further embodiment of a memory device in which a soft demapper accepts discrete-valued input.

FIG. 10 shows an exemplary embodiment in which a soft demapper 1130 residing on a controller chip 1102 is configured to receive a digital (discrete-valued) input y transmitted from a memory chip 1100. This input signal y may be formed, for example, by an analog-to-digital (ADC) component 1190 that quantizes the analog signal representative of the storage value of selected memory cell into multiple levels (e.g., as represented in a sequence of bits). The quantized signal can be transmitted to the soft demapper 1130 using any one of the digital transmission mechanisms described in the above section of Interface Examples.

In this embodiment, the soft demapper 1130 is able to process its digital input y to generate an analog output suitable for subsequent processing by a soft decoder 1140. This analog output can represent a degree of an association of the selected memory cell(s) with each one of a set of logic states, for example, using a probability-based measure, or alternatively a logarithmic-based measure. For purpose of illustration and without limitation, the following example of the soft demapper 1130 is specifically tailored to convert its digital input directly to analog (or pseudo-analog) LLR values, and in an approximate manner that can simplify circuit design without substantially deteriorating performance. In addition, this example can be particularly desirable in certain implementations, for example, for use with a soft decoder 1140 that exhibits improved performance on inputs received in the form of analog LLR values.

To facilitate discussions of the specific structure of the soft demapper 1130, assume that a PAM8 (i.e., 8-level amplitude modulated) Gray-coded constellation is used in the memory device of FIG. 10 for mapping input values to symbols, or to bit strings.

FIG. 11 shows one example of a PAM8 Gray-coded constellation. Here, the input values can correspond to, for example, voltage levels of the analog signal generated by the read circuit 1124. Each symbol represents one of the 8 logic states to which a memory cell can be written, and a string of 3 bits represents the data stored in the cell. For a noise-free memory device configured using this modulation scheme, ideally, the observed signal for a memory cell would only have the 8 discrete magnitude levels shown in the table, with each level corresponding to a respective symbol and a respective bit string. In practice, due to the presence of noise and/or variations from various sources, the magnitude of the observed signal may span over a continuous range of levels, and can be processed to determine a degree of association of the accessed memory cell with each of the 8 logic states (such as symbol probabilities), or with the values of the bit string (such as bit probabilities).

Figure 12:
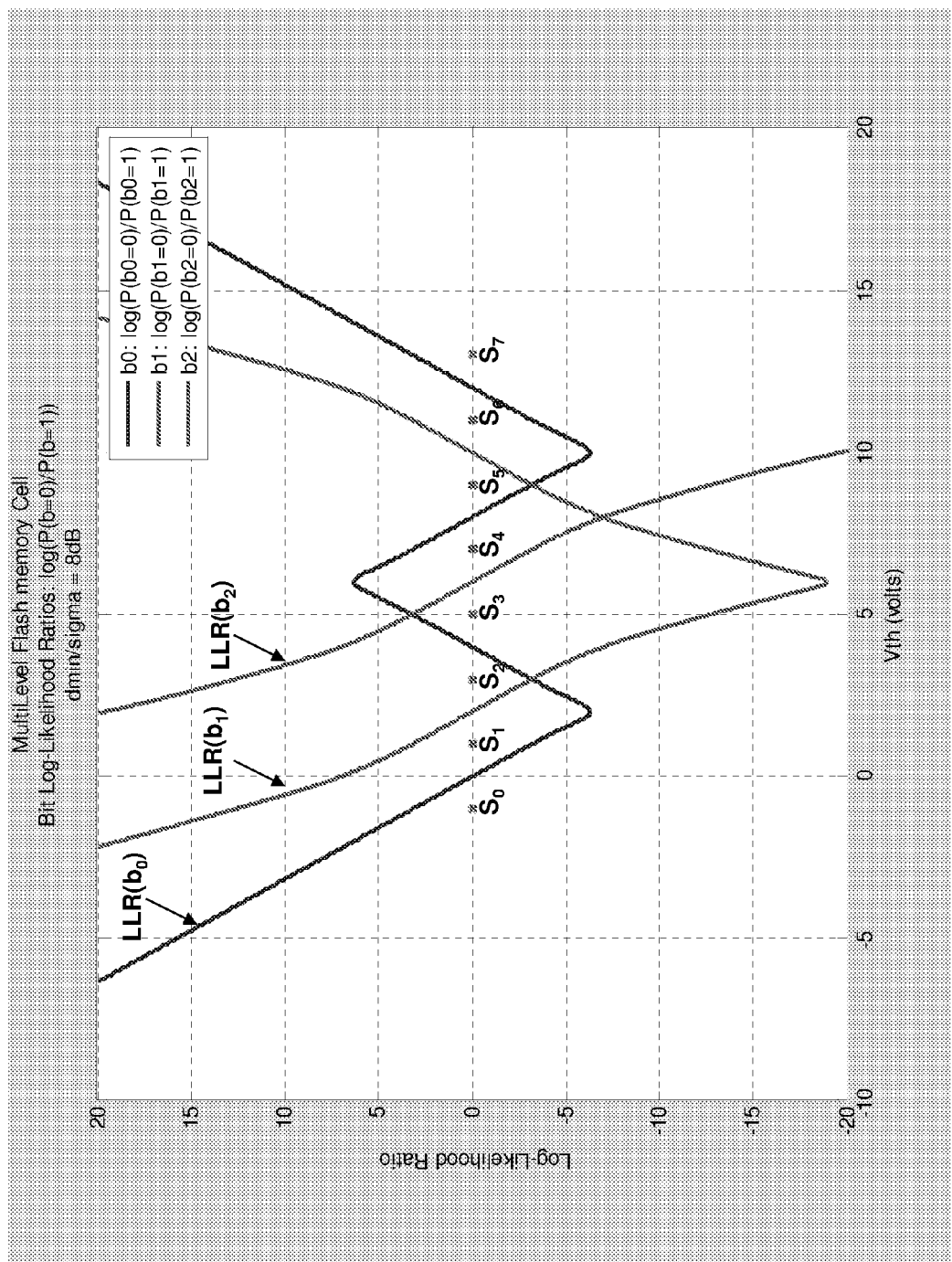
FIG. 12 shows simulated transfer functions of a soft demapper that accepts continuous-valued input.

FIG. 12 shows a simulated prediction of bit probabilities (in the form of LLR values) as a function of a continuous-valued signal observed from a memory cell. This prediction is obtained based on a statistical model of the specific noise characteristics of this memory device, as further discussed in the attached Appendix. Here, each of the three curves represents an LLR-based measure $LLR(b_i)$ of a corresponding bit $b_i$ as a function of input voltage, where $LLR(b_i)$ is defined as $LLR(b_i)=\log(P(b_i=0)/P(b_i=1))$. The overall shape of the individual curve is a result of applying the constellation shown in FIG. 11. Along the horizontal axis, each of the eight "x" points corresponds to a voltage level that is mapped to a respective symbol in the constellation.

Discussed below is one approach for designing a soft demapper that can generate output based on a discrete-valued input (rather than continuous-valued input) by approximating the LLR-based transfer functions shown in FIG. 12. This approach makes the following two assumptions. First, the exact (or theoretical) transfer functions can be reasonably decomposed into piece-wise linear segments from which the approximate transfer functions of the soft demapper are built. Secondly, each approximate transfer function is limited (capped) by upper and lower bounds on the vertical axis.

Figure 13:
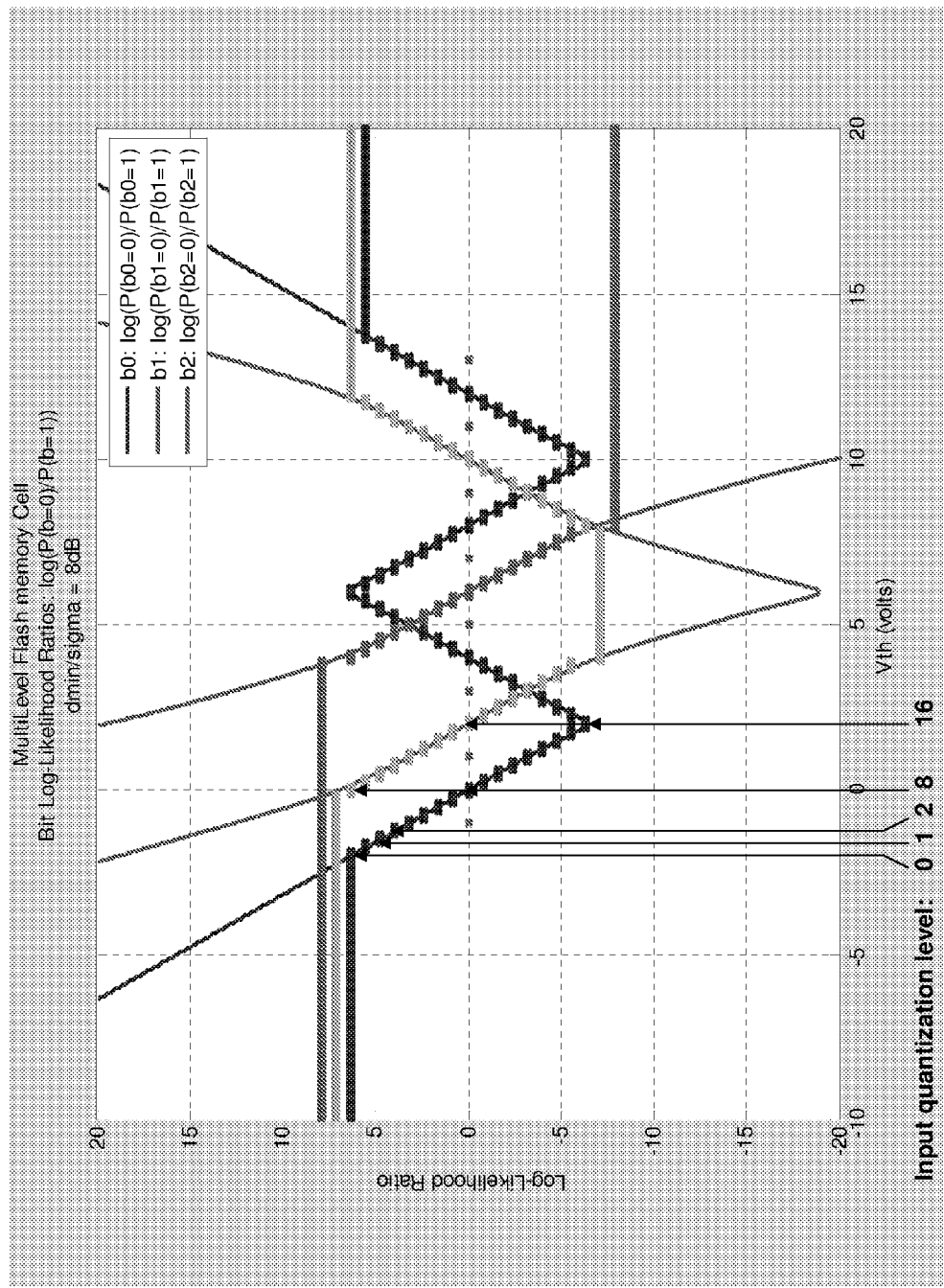
FIG. 13 shows approximated transfer functions of a soft demapper that accepts discrete-valued input.

FIG. 13 shows one example of designing the approximate transfer functions according to these two assumptions. For instance, the W-shaped LLR($b_0$) curve is capped at the level of "6" along the vertical axis, while its uncapped portion is divided into a set of 64 linear segments, with each segment corresponding to a sub-range of voltage levels. In the case of soft demapper with discrete-valued input, each linear segment can correspond to one of a set of 64 discrete input levels.

As previously discussed, information about a memory cell is initially obtained as a continuous-valued signal by the read circuit 1124. The ADC component 1190 quantizes the range of possible values of the signal into distinct non-overlapping segments to provide the discrete-valued input y to the demapper. This input y encodes which segment the value of the original signal was in.

Note that the number of quantization levels created by the ADC component 1190 can be an important design parameter. Some quantization schemes can preserve adequate amount of information without creating an overly large dataset or introducing substantial noise. This may be desirable in some applications. For instance, according to the PAM8 constellation of FIG. 11, exactly 3 bits of information is used to describe the hard data stored in a memory cell. However, digitizing the continuous-valued signal into only 8 levels (3-bit) may not provide adequate data for decoding soft information. To extract additional soft information and to increase the chances that the decoder can detect and correct errors, a finer quantization scheme may be used.

In the example of FIG. 13, the continuous-valued signal is quantized by the ADC component 1190 to a set of 64 discrete levels, represented by a total of 6 bits. As a result, each of the 64 linear segments of the W-shaped LLR($b_0$) corresponds to a respective input level selected from 0 to 63.

Using the above-described design approach, each of the three LLR transfer functions can be reasonably approximated down to certain number of linear segments, each of which has identical resolution and can be realized using unsophisticated digital logic. Accordingly, the soft demapper 1130 can operate, for example, by first determining the LLR values of a given discrete-valued input signal using look-up tables and subsequently converting the determined LLR values to an analog output using conventional digital-to-analog converters (DACs). In some implementations, for instance, where the soft demapper and the soft decoder separately reside on memory chip and controller chips, the soft demapper can be configured to directly output the LLR values in the digital form (without converting to analog LLR values). The LLR values are then provided to the controller chip, for example, as digital signals, which can be subsequently converted by a DAC on the controller chip to analog signals to be decoded by the soft decoder.

Figure 14:
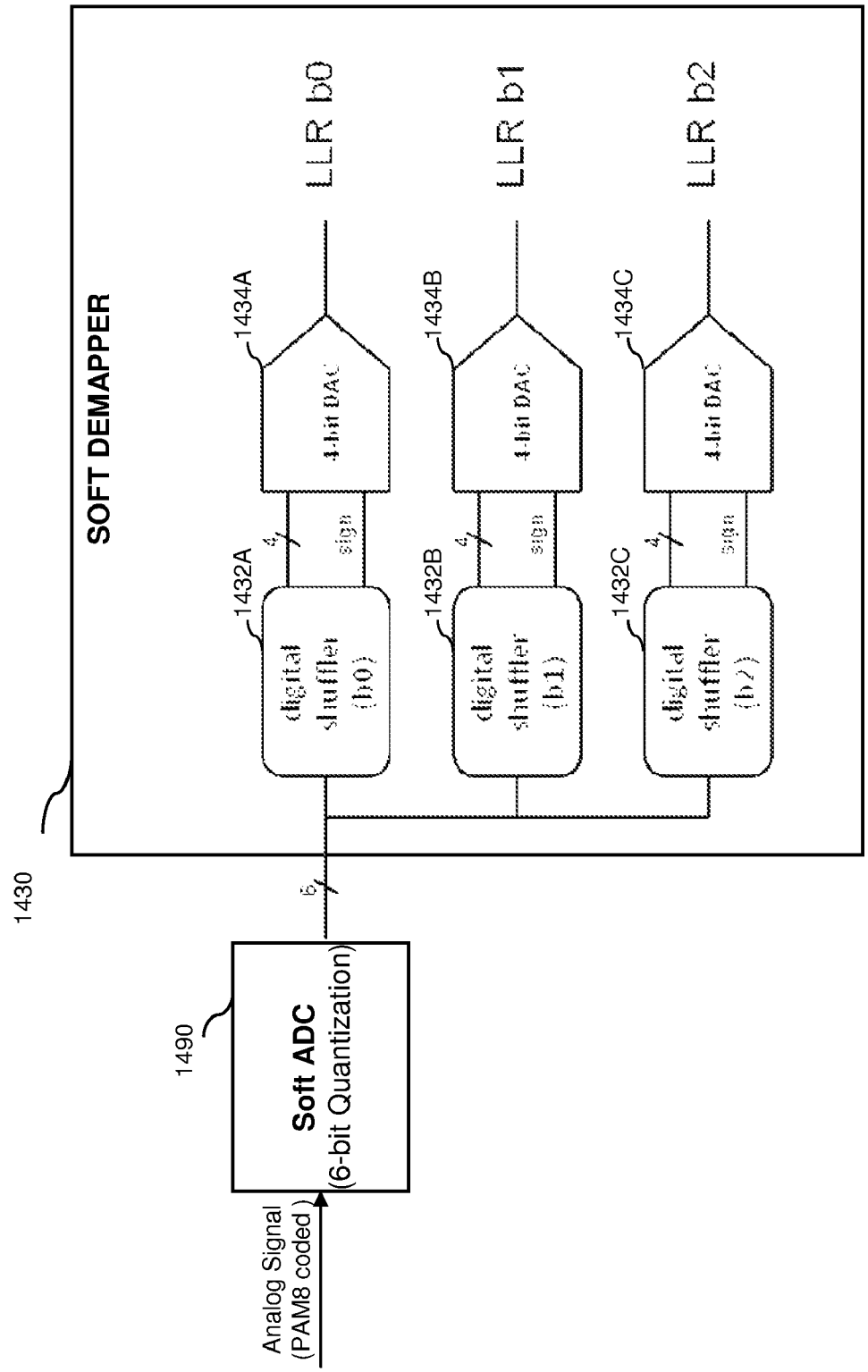
FIG. 14 shows one implementation of a soft demapper that accepts discrete-valued input to continuous-valued output.

FIG. 14 shows a block diagram of a soft demapper 1430 that accepts a 6-bit input signal from a soft ADC 1490. The soft demapper 1430 includes three digital shufflers 1432A, 1432B, and 1432C, each coupled to a corresponding DAC 1434A, 1434B, 1434C. Each pair of digital shuffler and DAC is configured to process the 6-bit input to generate an analog signal representing the value of a corresponding LLR($b_i$).

For instance, the digital shuffler 1432A accepts a 6-bit input signal that has a level from 0 through 63 and translates this input to a corresponding LLR($b_0$) value according to the "segmented" transfer functions shown in FIG. 13. This LLR ($b_0$) value is represented as a 4-bit sequence to be output to the 4-bit DAC 1434A. Depending on the particular applications, the digital shufflers can be implemented, for example, using look-up tables or using logic gates that can compute logic functions (or approximations of logic functions).

FIG. 15 shows one exemplary mapping by which the digital shuffler 1432A converts the received 6-bit input signal to generate a 4-bit output sequence. Here, signals with levels from 0 through 15 will be converted by the digital shuffler 1432A respectively to codes 0 through 15, as represented by 4-bit binary sequences (0000 through 1111) and with an additional sign bit of "0" indicating the negative slope of this range of the segmented transfer function LLR($b_0$). This sign bit will be later used to determine the polarity of the mapping of the codes to the 4-bit output sequence. Signals with levels from 16 through 31 will also be mapped to codes 0 through 15, but with a sign bit of "1" indicating the positive slope of this part of the transfer function. Similarly, signals with levels from 32 through 47 will be mapped to codes 0 through 15 with a sign bit of "0," whereas signals with levels from 48 through 63 will be mapped to codes 0 through 15 with a sign bit of "1." The 4-bit code together with the sign bit are used to determine the output bit sequence of the digital shuffler 1432A, as shown in the table. Once generated, the output bit sequence is converted by the 4-bit DAC to produce an analog output of the demapper, for example, a voltage or current signal to be subsequently used for decoding.

The digital shuffler 1432B operates in a similar manner as shuffler 1432A but with a different mapping. Here, signals with levels from 8 through 23 will be mapped to codes 0 through 15, with a sign bit of "0," whereas signals with levels from 40 through 55 will be mapped to codes 0 through 15, with a sign bit of "1." Any signal outside those two level ranges, for example, at the bottom-tip of the V-shaped curve in FIG. 13, will be mapped to a predefined maximum or minimum limit (e.g., code 0 or 15).

For the digital shuffler 1432C, only signals with levels from 24 through 39 will be mapped to codes 0 through 15, with a sign bit of "0." Again, the remaining levels are mapped to a predefined maximum or minimum limit.

As such, the soft demapper 1430 shown in FIG. 14 can be synthesized with a simple and repetitive structure with a small number of unique elements. This may reduce circuit complexity without significantly affecting the demapping performance. In addition, the analog output of the soft demapper 1430 can be directly supplied to a soft decoder that operates on analog LLR values, without the need for intermediate signal processing or conversion circuits.

In some examples, alternative to the mapping scheme shown in FIG. 15, the digital shufflers 1432A-1432C may be configured to convert its 6-bit input sequence to a 4-bit output sequence in a different manner. For example, in the case of digital shuffler 1432A of FIG. 15, for input signals with levels from 16 through 31 (shown as 010000 to 011111), instead of mapping these signals first to codes 0 through 15 and then using a sign bit of "1" to reverse the order of the codes to generate the output 4-bit sequence, an alternative implementation directly maps input signal levels 16 through 31 to codes 15 through 0 (i.e., the same as the output bit sequence) without using the sign bit. This way, the soft demapper 1430 can rely on its digital logic to handle the appropriate mapping, without requiring the use of a DAC that can change its polarity.

In some examples, as the noise characteristics (e.g., the sigma of a Gaussian noise) of the channel may change, the DACs 1434A-1434C used in the soft demapper 1430 can include an adjustable gain element to control the slope of digital-to-analog conversion in combination with changing the mapping characteristics of the demapper. Such a feature may be desired in certain applications (e.g., Flash memories) for the purpose of providing fine tuning and calibration (even when the sigma of the channel may not change substantially), as well as in other types of applications (e.g., wireless communication channels) where the sigma of the channel can change with many different factors.

As described in an earlier section of this document, the analog signal generated by the read circuit 1124 may exhibit non-linearity due to a number of factors, such as non-uniform noise distribution for states $S_i$, non-uniform spacings between the states $S_i$, and/or non-linear current-voltage characteristics of the transistors in the memory cell. One way to account for such non-linearity is to implement a signal transformation circuit preceding the ADC 1190 to linearize the analog signal before it is converted into the digital form. An alternative way is to configure the digital shufflers 1432A-1432C in the soft demapper 1430 of FIG. 14 to implement a proper mapping of its input digital signal to the output (e.g., using a customized look-up table) that accounts for the non-linearity in the signals.

Note that the above discussed D-to-LLR (digital input to analog LLR output) demapper design can be adapted for use with some conventional memory chips in which memory values are read as digital signals, for instance, by a thresholding device (such as sense amplifier). Such digital signals can be provided to the D-to-LLR demapper to generate continuous-valued LLR representations of bit (or symbol) probabilities of the accessed memory cells, which can subsequently be decoded in an analog or digital decoder.

The D-to-LLR demapper can also have important applications outside the context of memory devices. For example, many conventional error correction decoders are implemented digitally, which requires that soft information be provided to the decoder in digital form. Alternative to those digital decoders, new development of decoders with analog components are currently underway. A suitable interface, like this D-to-LLR demapper, can be necessary to appropriately and efficiently enable such a replacement.

In some implementations of the soft demapper discussed above, it is assumed that a demapper with discrete-valued input would ideally compute the same transfer functions as if it had received a continuous-valued input. In some practical applications, the design of transfer functions may have slight differences between those two cases. Related discussions are provided in the attached Appendix.

7 Extensions and Applications

Although the above description is made primarily in the context of flash memories, it should be noted that the general approaches are readily applicable to other types of storage devices. One example is a dynamic random access memory (DRAM), which includes a memory array having one transistor and one capacitor per cell. Another example is a multi-level storage having an array of capacitive elements (e.g., capacitors) for carrying storage values.

Figure 7:
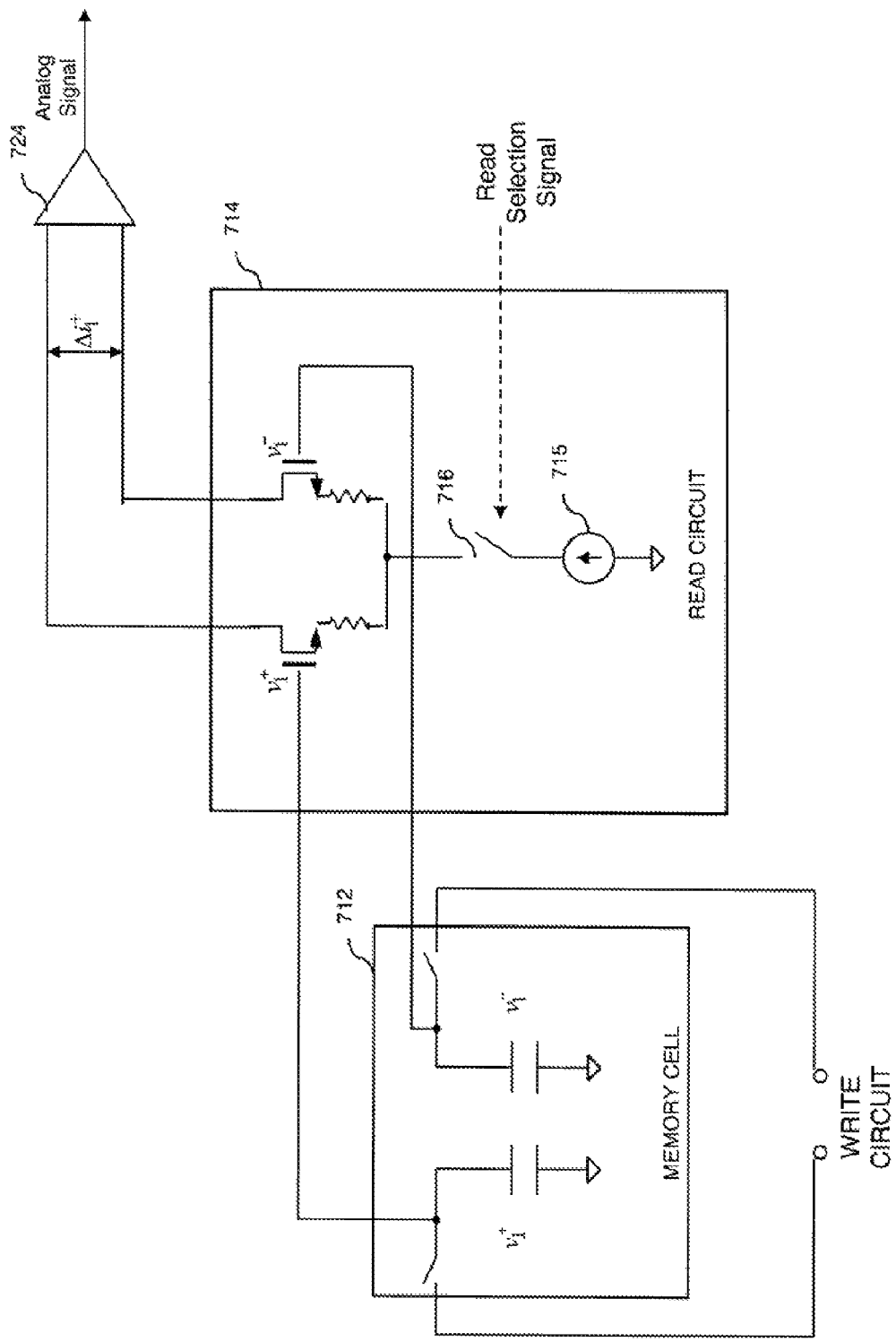
FIG. 7 shows an alternative memory cell.

FIG. 7 shows one example of a multi-level storage having an array of capacitive memory cells 712. Each memory cell 712 includes a pair of capacitors that can be charged to a discrete set of logic states by a write circuit according to a differential voltage ($v^+-v^-$) (or alternatively, according to a single-ended voltage). Each logic state of the cell 712 corresponds to a storage value represented by a differential voltage level carried by the pair of capacitors. A read circuit 714 includes a differential amplifier selectively coupled to a current source 715. To read the memory cell, a "read selection signal" activates the switch 716 to couple the current source 715 to the differential amplifier, which then converts the differential voltage on the memory cell 712 representing the storage value into a differential current signal $\Delta i_1$. The differential current signal is then provided to a conversion unit 724 (e.g., to be transformed to a differential voltage signal) to generate an analog signal that can be subsequently processed by the soft demapper 330 shown in FIG. 3.

In this description, most of the demapper and decoder circuit examples are illustrated as being configured to process input and output signals in a single-ended form. Note that circuits that process differential signals are also possible. In some applications, it may be useful to adopt differential signals in circuit design over single-ended signals. Advantages of differential signals may include, for example, a larger dynamic range for circuit operation and higher noise immunity (such as common mode rejection). For instance, if a constant noise is introduced to both wires of the differential input (or output), it is possible to design gate circuits that will ignore this constant additive factor and will primarily respond to the difference between the signals on the two wires.

In the above description, the analog signal retrieved from the memory cells is described as being processed in the soft demapper circuit and the soft decoder circuit using currents and/or voltages representing probabilities. In some other applications, the signal may be processed alternatively to produce representations in the log domain, for example, log-odds or log likelihood ratio (LLR). For example, the soft demapper 330 of FIG. 3 may be configured to be operable in the log regime, for example, by coupling the original circuit with additional processing components that convert the bump-shaped or S-shaped transfer functions to the desired forms in the log domain. Alternatively, the soft demapper 330 of FIG. 3 may be configured to be operable in the log regime, for example, by simply setting the parameter $a_k$ and $b_k$ to best approximate the desired transfer functions. Further discussions of the implementation of a demapper operable in the log domain are provided in U.S. Patent Application Ser. No. 61/156,721, titled "Signal Mapping," filed on Mar. 2, 2009.

In the example of FIG. 3, the soft demapper 330 is shown to perform a two-stage processing to transform its input signal first to the probabilities of states $P(S_i)$ then to the probabilities of bits $P(b_i)$. In some other examples, the soft demapper 330 is configured to perform a single-stage processing to transform its input signal directly to the probabilities of bits $P(b_i)$. In some further examples, the soft demapper 330 outputs the probabilities of states $P(S_i)$ (rather than the probabilities of bits $P(b_i)$) to be processed by the soft decoder 340 for generating the decoded digital bit stream.

In the above examples, when reading a memory cell, a fixed-amplitude read voltage is applied to the cell to induce a current signal. The fixed-amplitude read voltage is selected such that the induced current signal provides sufficient information for the demapper to generate a complete reliability representation that encompasses, for example, the entire set of probabilities of the memory cell being at each one of its possible logic states (e.g., 8 states for a 3-bit cell).

Figure 8:
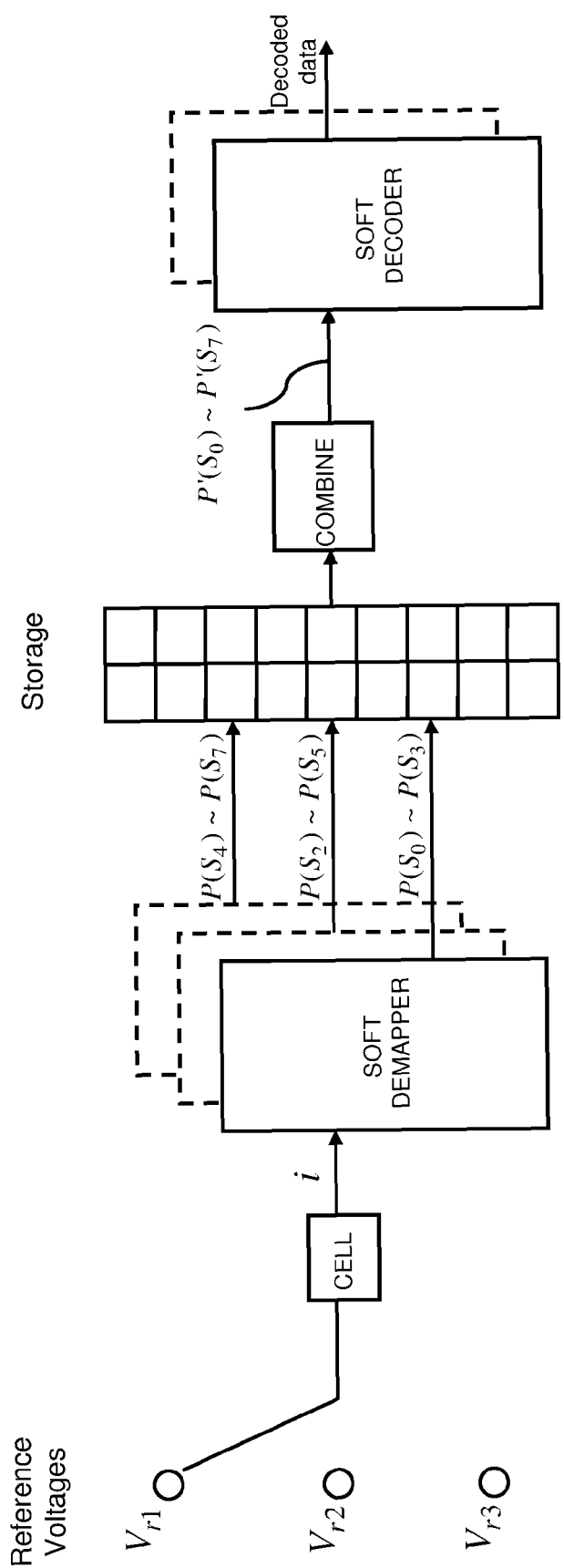
FIG. 8 shows an alternative read operation.

In some other examples, instead of using a single read voltage, a set of two or more read voltages is applied in successive steps in one read operation such that each one of the read voltages results in a current signal that can be used to determine a portion of the reliability representation, for example, the probabilities of the memory cell being at each one of a selected subset of possible logic states (e.g., a subset of 3 states out of a total of 8 states). In those cases, the current signals produced at different steps can be either processed in a respective demapper configured specific to the corresponding read voltage, or alternatively, be processed in a shared demapper whose mapping characteristics are reconfigured at each step. As each output of the demapper(s) corresponds to a portion of the reliability representation, they can be combined to produce a complete reliability representation that includes, for example, the entire set of probabilities of the memory cell being at each one of the possible logic states. In some implementations, the outputs of a reconfigurable demapper, once generated, are first stored in an intermediate storage (e.g., in an analog memory) before being retrieved for generating the complete reliability representation. This multi-step read approach is also illustrated in FIG. 8.

Note that the above described multi-step read approach can be useful, for example, where it is difficult to use one read voltage to produce a single current signal with a signal range sufficiently broad for covering the entire set of possible logical states, or where it is difficult to generate a single current signal that can represent every stored value of the memory cell without introducing substantial non-linear noise components at the end levels. In such cases, a set of read voltages are used to produce multiple current signals with each current signal covering a sub-range of the horizontal axis of the transfer functions (that is, each current signal yielding a reliability representation of a selected subset of logical states). In some examples, the current signals may yield reliability representations of overlapping subsets of logical states, for example, with read voltages $V_{r1}$ $V_{r2}$ $V_{r3}$ resulting in current signals that respectively produce subsets of $P(S_0)$~$P(S_3)$, $P(S_2)$~$P(S_5)$, and $P(S_4)$~$P(S_7)$. When these three subsets of probabilities are combined, a complete reliability representation can be generated, and in some cases, even at a sub-state resolution.

In addition to being used in the memory device of FIG. 3 where the soft demapper 330 accepts analog input, this multi-step read approach can also be applied in memory devices that use the D-to-LLR demapper 1430 shown in FIG. 14. In the latter case, the current signals generated by successive voltage applications can be first combined into a single signal prior to being digitized by the soft ADC 1490 and processed by the soft demapper 1430, or alternatively, be individually digitized and processed separately in the soft demapper 1430 and be later combined to generate the LLR outputs using proper conversion schemes.

In some further embodiments, the multi-step read approach can be alternatively implemented by adding storage elements before (rather than after) a soft demapper. Accordingly, current signals induced from a memory cell(s) by successive read voltage applications can be temporarily stored and then provided to the soft demapper to produce $P(S_0)$~$P(S_7)$. Alternatively, the current signals may be first processed, for example, to generate a combined signal (e.g., a voltage signal, a current signal, or other forms of signals) that can represent the whole range of storage values, and this combined signal is subsequently provided to the soft demapper.

Note that in some of the above illustrated examples, the analog signal induced from a memory cell(s) (e.g., as shown in FIG. 3 and FIG. 9A) may include one or more analog signals, for instance, one or more current signals. In some examples, a section of memory cells may be read simultaneously and the corresponding current signals from those cells are demapped (and/or decoded) collectively. In some examples, multiple copies of a soft demapper (and/or multiple copies of a soft decoder) may be implemented such that each copy is configured to process a corresponding subset of the current signals.

Note that the soft error correction approaches described above can be implemented on memory devices with traditional hard error correction/reduction by adapting their existing circuit components and read logic for use with the soft demapper and the soft decoder.

For example, to read a 2-bit (i.e., 4-state) memory cell, one traditional method is to apply a series of three different reference voltages (e.g., from low to high or in an otherwise predefined order) to the control gate of the cell, and at each voltage application, to compare the source-drain current with a threshold current level to form a hard decision of whether the cell's threshold voltage is higher or low than the applied reference voltage and therefore to determine to which state the cell was programmed. One way to incorporate soft error correction to this traditional read method uses the multi-step read approach described above, where each read voltage can be selected from the existing reference voltages in traditional memory devices.

In this document, the term "probability" is not necessarily limited to a probability representation in the linear domain (e.g., linear probabilities). It can also refer to a probability representation in the logarithmic domain (e.g., log odds, log likelihood ratios, etc.). Furthermore, it can also refer to measures of certainty or likelihood that are not strictly probabilistic. Other examples include monotonic functions and/or approximations of various probability representations.

Please also see Appendix (5 pages including cover page) for discussions of demapper variations in the context of continuous-valued input signals and digital input signals.

It is to be understood that the foregoing description is intended to illustrate and not to limit the scope of the invention, which is defined by the scope of the appended claims. Other embodiments are within the scope of the following claims.

What is claimed is:

1. A circuit comprising:
a signal processing circuit for accepting a discrete-valued input characterizing an observation of a signal and for generating a set of continuous-valued outputs, each output characterizing a corresponding log likelihood ratio (LLR) based measure of an association of the signal with one or more of a set of representative levels, the signal processing circuit including:
a plurality of mapping circuits, each configured to map a different range of the discrete-valued input to a respective discrete-valued output signal according to a modeling of the characteristics of the observation of the signal; and
a plurality of conversion circuits each configured for accepting the discrete-valued output signal of a corresponding mapping circuit to generate a respective one of the set of continuous-valued output.

2. The circuit of claim 1, wherein the observation of the signal includes an observation of a physical state of a selected storage element of a storage array having a plurality of storage elements.

3. The circuit of claim 2, wherein each one of the set of representative levels associated with the signal corresponds to a respective one of a set of physical states to which the storage element can be written.

4. The circuit of claim 3, further comprising a pre-processing circuit coupled to the signal processing circuit for generating the discrete-valued input of the signal processing circuit characterizing the observation of physical state of the storage element.

5. The circuit of claim 4, wherein the pre-processing circuit includes a read circuit for selecting the storage element from the plurality of storage elements to generate a discrete-valued signal representing the physical state of the selected storage element and for providing this discrete-valued signal as input to the signal processing circuit.

6. The circuit of claim 5, wherein the read circuit includes a thresholding device.

7. The circuit of claim 6, wherein the thresholding device includes a sense amplifier.

8. The circuit of claim 4, wherein the pre-processing circuit includes a read circuit for selecting the storage element from the plurality of storage elements to generate a continuous-valued signal representing the physical state of the selected storage element.

9. The circuit of claim 8, wherein the pre-processing circuit further includes an analog-to-digital converter for converting the continuous-valued signal representing the physical state of the storage element into a discrete-valued signal, and for providing this discrete-valued signal as input to the signal processing circuit.

10. The circuit of claim 3, further comprising a decoder circuit coupled to the signal processing circuit for processing the set of continuous-valued outputs of the signal processing circuit to generate a digital representation of the physical state of the storage element.

11. The circuit of claim 10, wherein the decoder circuit includes an analog decoder core configured for, in each of a plurality of cycles of a decoding operation, accepting a portion of code data and a portion of an intermediate value date to generate an output.

12. The circuit of claim 11, wherein the decoder circuit further includes an analog storage for storing the output of the analog decoder core.

13. The circuit of claim 11, wherein the portion of code data accepted in each of the plurality of cycles of the decoding operation includes data representing the physical state of each of a subset of two or more storage elements selected from the storage array.

14. The circuit of claim 1, wherein the modeling of the characteristics of the observation of the signal includes a modeling of an expected degree of variability in the observation of the signal.

15. The circuit of claim 1, wherein each one of the plurality of mapping circuits forms a substantially piece-wise linear mapping of the different range of the discrete-valued input to the respective discrete-valued output signals.

16. The circuit of claim 1, wherein each mapping circuit includes a look-up table.

17. The circuit of claim 1, wherein each mapping circuit includes one or more logic gates.

18. The circuit of claim 1, wherein each conversion circuit includes a digital-to-analog converter.

* * * * *